United States Patent
Kato et al.

(10) Patent No.: US 7,842,584 B2
(45) Date of Patent: Nov. 30, 2010

(54) METHOD FOR MANUFACTURING SEMICONDUCTOR DEVICE

(75) Inventors: Sho Kato, Isehara (JP); Fumito Isaka, Zama (JP); Tetsuya Kakehata, Isehara (JP); Hiromichi Godo, Atsugi (JP); Akihisa Shimomura, Isehara (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 1 day.

(21) Appl. No.: 12/339,413

(22) Filed: Dec. 19, 2008

(65) Prior Publication Data
US 2009/0162992 A1 Jun. 25, 2009

(30) Foreign Application Priority Data
Dec. 25, 2007 (JP) .............................. 2007-331656

(51) Int. Cl.
*H01L 21/18* (2006.01)
(52) U.S. Cl. ................. 438/458; 257/E21.088
(58) Field of Classification Search .......... 257/E21.088, 257/E21.133, E29.28; 438/458
See application file for complete search history.

(56) References Cited

U.S. PATENT DOCUMENTS

| | | | |
|---|---|---|---|
| 5,374,564 A | 12/1994 | Bruel | |
| 5,714,395 A * | 2/1998 | Bruel | 438/528 |
| 5,894,151 A | 4/1999 | Yamazaki et al. | |
| 6,127,702 A | 10/2000 | Yamazaki et al. | |
| 6,251,754 B1 | 6/2001 | Ohshima et al. | |
| 6,271,101 B1 | 8/2001 | Fukunaga | |
| 6,335,231 B1 | 1/2002 | Yamazaki et al. | |
| 6,380,046 B1 | 4/2002 | Yamazaki | |
| 6,388,652 B1 | 5/2002 | Yamazaki et al. | |
| 6,602,761 B2 | 8/2003 | Fukunaga | |
| 6,686,623 B2 | 2/2004 | Yamazaki | |
| 6,709,907 B1 | 3/2004 | Yamazaki et al. | |
| 6,778,164 B2 | 8/2004 | Yamazaki et al. | |
| 6,803,264 B2 | 10/2004 | Yamazaki et al. | |
| 6,875,633 B2 | 4/2005 | Fukunaga | |
| 6,908,797 B2 | 6/2005 | Takano | |
| 7,148,542 B2 | 12/2006 | Yamazaki et al. | |
| 7,176,525 B2 | 2/2007 | Fukunaga | |
| 7,199,024 B2 | 4/2007 | Yamazaki | |

(Continued)

FOREIGN PATENT DOCUMENTS

JP 05-326962 12/1993

(Continued)

*Primary Examiner*—W. David Coleman
*Assistant Examiner*—Daniel Shook
(74) *Attorney, Agent, or Firm*—Eric J. Robinson; Robinson Intellectual Property Law Office, P.C.

(57) ABSTRACT

There are provided a semiconductor device having a structure which can realize not only suppression of a punch-through current but also reuse of a silicon wafer used for bonding, in manufacturing a semiconductor device using an SOI technique, and a manufacturing method thereof. A semiconductor film into which an impurity imparting a conductivity type opposite to that of a source region and a drain region is implanted is formed over a substrate, and a single crystal semiconductor film is bonded to the semiconductor film by an SOI technique to form a stacked semiconductor film. A channel formation region is formed using the stacked semiconductor film, thereby suppressing a punch-through current in a semiconductor device.

19 Claims, 14 Drawing Sheets

U.S. PATENT DOCUMENTS

| | | |
|---|---|---|
| 7,256,776 B2 | 8/2007 | Yamazaki et al. |
| 7,339,235 B1 | 3/2008 | Yamazaki et al. |
| 2004/0104424 A1 | 6/2004 | Yamazaki |
| 2005/0009252 A1 | 1/2005 | Yamazaki et al. |
| 2005/0260800 A1 | 11/2005 | Takano |
| 2006/0272574 A1* | 12/2006 | Waite et al. ............ 117/89 |
| 2006/0292778 A1 | 12/2006 | Sekiguchi |
| 2007/0087488 A1 | 4/2007 | Moriwaka |
| 2007/0096210 A1 | 5/2007 | Yamazaki et al. |
| 2007/0108510 A1 | 5/2007 | Fukunaga |
| 2007/0173000 A1 | 7/2007 | Yamazaki |
| 2007/0184632 A1 | 8/2007 | Yamazaki et al. |
| 2007/0281399 A1 | 12/2007 | Cites et al. |
| 2007/0291022 A1 | 12/2007 | Yamazaki et al. |
| 2009/0020815 A1 | 1/2009 | Godo |

FOREIGN PATENT DOCUMENTS

| | | |
|---|---|---|
| JP | 07-142738 | 6/1995 |

* cited by examiner

METHOD FOR MANUFACTURING SEMICONDUCTOR DEVICE

BACKGROUND OF THE INVENTION

1. Field of the Invention

The present invention relates to a method for manufacturing a semiconductor device. Specifically, the present invention relates to a technique for reducing a punch-through current in a thin film transistor (TFT) which is formed using a silicon on insulator (SOI) substrate formed by a bonding technique.

2. Description of the Related Art

In recent years, in accordance with the improvement in characteristics of an integrated circuit, a semiconductor element such as a TFT has been miniaturized. However, various problems have arisen by fabrication of a submicron region.

As a typical problem, a phenomenon called a short-channel effect is known. The short-channel effect is a phenomenon in a semiconductor element having a channel formation region between a source region and a drain region, which is caused because, as the channel formation region is shortened, electric charge in a channel formation region is largely influenced not only by a gate voltage but also by electric charge of a depletion layer, an electric field, and electric potential distribution in the source region and the drain region.

As an influence of the short-channel effect on a semiconductor element, reduction in threshold voltage ($V_{th}$) and a punch-through current are known.

With reduction in threshold voltage, power consumption can be reduced. However, frequency characteristics do not generally become high with reduction in driving voltage of an integrated circuit. Thus, as a method for controlling the threshold voltage, a method is employed in which an impurity element imparting one conductivity type is added to the entire channel formation region in order to control the threshold voltage by the added amount of the impurity element. However, there is a problem in that carriers are scattered by the added impurity and thus the mobility of the carriers is lowered.

Furthermore, it is known that when the influence of a gate voltage on a drain current is reduced due to a punch-through current, subthreshold characteristics become worse and switching characteristics of a semiconductor element are deteriorated. As a method for suppressing a punch-through current, there is a method in which a channel formation region is formed to have a thin thickness; however, with the channel formation region formed to have a thin thickness, the following problem arises: resistance between a source region and a drain region is increased and an ON current of the semiconductor element is decreased.

As another method for suppressing a punch-through current, there is a method in which an impurity element imparting a conductivity type opposite to that of a source region and a drain region is implanted into a bottom portion of a channel formation region; however, it is difficult to implant the impurity element only into the bottom portion of the channel formation region from the surface of the channel formation region.

Furthermore, a method is known in which, using an SOI technique, an impurity element imparting a conductivity type opposite to that of a source region and a drain region is implanted into a silicon substrate, and then, the silicon substrate is bonded to a base substrate and polished, thereby forming an impurity-implanted region for suppressing a punch-through current in a bottom portion of a channel formation region of a semiconductor element which is formed over the base substrate (For example, see Reference 1: Japanese Published Patent Application No. H5-326962 and Reference 2: Japanese Published Patent Application No. H7-142738).

However, in the case of applying such a method, since the impurity element is implanted into the silicon substrate, after the bonding, the silicon substrate which is separated from the base substrate cannot be reused efficiently, and there is a problem of how to save resources.

SUMMARY OF THE INVENTION

It is one of objects of the present invention to provide a method for manufacturing a semiconductor device having a structure which can realize not only suppression of a punch-through current but also reuse of a silicon wafer which is used for bonding, in manufacturing a semiconductor device using an SOI technique.

One of features of the present invention is a method for manufacturing a semiconductor device which can suppress a punch-through current, by forming a semiconductor film into which an impurity imparting a conductivity type opposite to that of a source region and a drain region is implanted over a substrate, bonding a single crystal semiconductor film to the semiconductor film by an SOI technique to obtain a semiconductor film with a stacked layer structure, and forming a channel formation region using the semiconductor film with a stacked layer structure.

One of aspects of the present invention is a method for manufacturing a semiconductor device including a source region, a drain region, and a channel formation region in a semiconductor film over a substrate. In the method, irradiation with an ion species is performed to the surface of a single crystal semiconductor substrate to form a brittle layer in a region at a predetermined depth from the surface of the single crystal semiconductor substrate; the surface of the single crystal semiconductor substrate is bonded to the surface of another substrate; heat treatment is performed in a state in which the single crystal semiconductor substrate and the substrate overlap with each other; a crack is generated in the brittle layer and the single crystal semiconductor substrate is separated with part of the single crystal semiconductor substrate left over the substrate, to form a first semiconductor film comprising a single crystal semiconductor layer; one or both of an n-type impurity and a p-type impurity are added to the first semiconductor film by doping; and a second single crystal semiconductor film which is crystallized by epitaxy is formed over the first semiconductor film.

In the above method, before and after formation of the brittle layer, insulating films may be formed over the surface of the single crystal semiconductor substrate. Each of the insulating films which are formed here can be formed using one or more of a silicon oxide film, a silicon nitride film, a silicon oxynitride film, and a silicon nitride oxide film to have a single layer structure or a stacked layer structure.

Another one of aspects of the present invention is a method for manufacturing a semiconductor device including a source region, a drain region, and a channel formation region in a semiconductor film over a substrate. In the method, irradiation with an ion species is performed through the surface of a single crystal semiconductor substrate to form a brittle layer in the single crystal semiconductor substrate in a region at a predetermined depth; a first semiconductor film which is an amorphous semiconductor film including an n-type impurity or a p-type impurity is formed over the single crystal semiconductor substrate; an insulating film is formed over the first semiconductor film; the surface of the insulating film is bonded to the surface of another substrate; heat treatment is performed in a state in which the single crystal semiconductor substrate and the substrate overlap with each other; and the first semiconductor film is crystallized by solid-phase epitaxy to be a single crystal semiconductor film and a crack is generated in the brittle layer to separate the single crystal semiconductor substrate with part of the single crystal semiconductor substrate left, thereby forming the insulating film, the first semiconductor film which is a single crystal semiconductor film, and a second semiconductor film which is the part of the single crystal semiconductor substrate over the substrate.

In the above method, the insulating film formed over the first semiconductor film can be formed using one or more of a silicon oxide film, a silicon nitride film, a silicon oxynitride film, and a silicon nitride oxide film to have a single layer structure or a stacked layer structure.

In the above method, before formation of the brittle layer, an insulating film may be formed over the surface of the single crystal semiconductor substrate. The insulating film which is formed here can be formed using one or more of a silicon oxide film, a silicon nitride film, a silicon oxynitride film, and a silicon nitride oxide film to have a single layer structure or a stacked layer structure.

In the above method, an insulating film may be formed over the second semiconductor film. The insulating film which is formed here can be formed using one or more of a silicon oxide film, a silicon nitride film, a silicon oxynitride film, and a silicon nitride oxide film to have a single layer structure or a stacked layer structure.

In each of the above methods, the impurity included in the first semiconductor film imparts a conductivity type which is opposite to that of the source region and the drain region.

In each of the above methods, the first semiconductor film includes the n-type impurity or the p-type impurity at a concentration of $5\times10^{15}$ to $5\times10^{17}$ atoms/cm$^3$ inclusive.

In each of the above methods, the heat treatment is performed at a temperature at which the element added to the brittle layer by the irradiation is removed, that is, at 400 to 600° C. inclusive.

By forming an impurity region imparting a conductivity type opposite to that of a source region and a drain region in a bottom portion of a channel formation region of a semiconductor element, a punch-through current can be suppressed, whereby a semiconductor device with high switching characteristics and high reliability can be manufactured. Note that in a manufacturing method, a semiconductor device is manufactured by an SOI technique, and a silicon wafer used for bonding is not contaminated with an impurity in the manufacturing process. Therefore, the silicon wafer can be reused in manufacturing another semiconductor device.

DETAILED DESCRIPTION OF THE INVENTION

Some of embodiment modes of the present invention will hereinafter be described in detail with reference to the drawings. Note that the present invention is not limited to the following description, and modes and details thereof can be variously modified without departing from the spirit and the scope of the present invention. Thus, the present invention should not be construed as being limited to the following description of the embodiment modes.

Embodiment Mode 1

In Embodiment Mode 1, a method for manufacturing an SOI substrate which is used in manufacturing a semiconductor device will be described with reference to FIGS. 1A to 1E and FIGS. 2A to 2D.

Figure 1A:
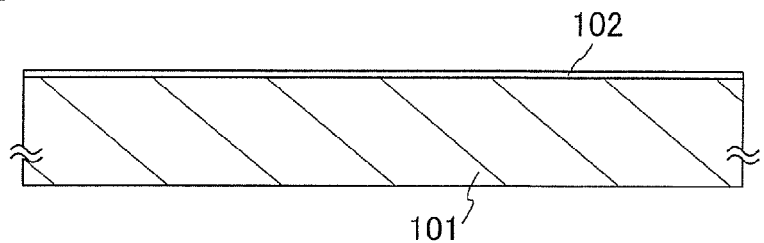
FIGS. 1A to 1E illustrate a method for manufacturing an SOI substrate.

As illustrated in FIG. 1A, a first insulating film 102 is formed over a semiconductor substrate 101. For the semiconductor substrate 101, a p-type or n-type single crystal silicon substrate (silicon wafer) can be used, as a typical example. Alternatively, other crystalline semiconductor substrates such as a substrate of silicon or germanium, a substrate of a compound semiconductor such as gallium arsenide or indium phosphide, and the like can also be used.

The first insulating film 102 can be formed of an insulating material such as silicon oxide, silicon nitride, or silicon including oxygen and nitrogen (silicon oxynitride) by a plasma CVD method, a low-pressure CVD method, a sputtering method, or the like. Alternatively, an oxide film formed by oxidizing the semiconductor substrate 101 can also be used. The first insulating film 102 has a thickness of 10 to 1000 nm (preferably 50 to 200 nm). Further, the first insulating film 102 may have a single layer structure or a stacked layer structure.

In the case of forming the oxide film, dry oxidation may be performed, and in that case, it is preferable to add a gas including halogen into an oxidation atmosphere. As the gas including halogen, one or more of HCl, HF, NF$_3$, HBr, Cl, ClF, BCl$_3$, F, Br$_2$, and the like can be used. For example, heat treatment is performed at a temperature of greater than or equal to 700° C. in an atmosphere including HCl at 0.5 to 10 vol % (preferably 3 vol %) with respect to oxygen. It is preferable that thermal oxidation be performed at heating temperatures of 950 to 1100° C. inclusive. Treatment time may be 0.1 to 6 hours, preferably 0.5 to 1 hour.

Figure 1B:
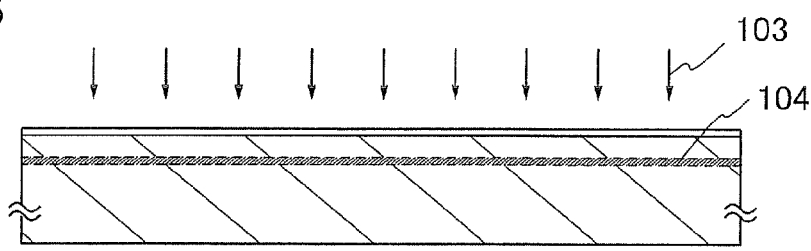

Next, irradiation with ions 103 accelerated by an electric field is performed through the surface of the first insulating film 102 to a predetermined depth, so that a brittle layer 104 is formed (FIG. 1B). The irradiation with the ions 103 is performed in consideration of the thickness of a first semiconductor film 107 which is to be transferred to another substrate. The thickness of the first semiconductor film 107 is 5 to 500 nm inclusive, preferably 10 to 200 nm inclusive. Accelerating voltage for irradiating the semiconductor substrate 101 with the ions is set in consideration of the above thickness.

The brittle layer 104 is formed by irradiation with ions of hydrogen, helium, or halogen typified by fluorine. Note that examples of a method for the irradiation with ions for forming the brittle layer 104 include a so-called ion doping method and ion implantation method. In this case, it is preferable to perform irradiation with one kind of ions or plural kinds of ions of the same atom with different masses. In the case of irradiation with hydrogen ions, it is preferable that the hydrogen ions include $H^+$, $H_2^+$, and $H_3^+$ ions with a high proportion of $H_3^+$ ions. With a high proportion of $H_3^+$ ions, the irradiation efficiency can be increased and irradiation time can be shortened. With this structure, separation can be conducted easily.

Figure 1C:
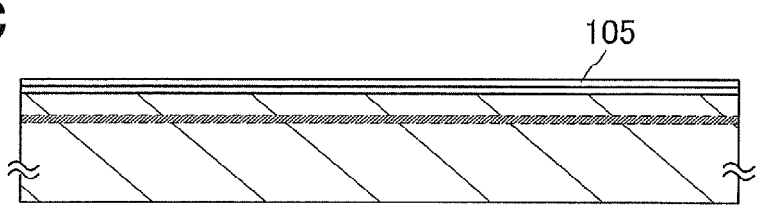

Next, a second insulating film 105 is formed (FIG. 1C). The second insulating film 105 can be formed of an insulating material such as silicon oxide, silicon nitride, or silicon including oxygen and nitrogen (silicon oxynitride) by a plasma CVD method, a low-pressure CVD method, a sputtering method, or the like. The second insulating film 105 has a thickness of 10 to 1000 nm (preferably 50 to 200 nm) and may have a single layer structure or a stacked layer structure. The second insulating film 105 is not necessarily provided, but is effective in preventing an impurity such as alkali metal from a substrate 106 from diffusing into and contaminating the first semiconductor film 107 which will be formed over the substrate 106, in a later step.

Figure 1D:
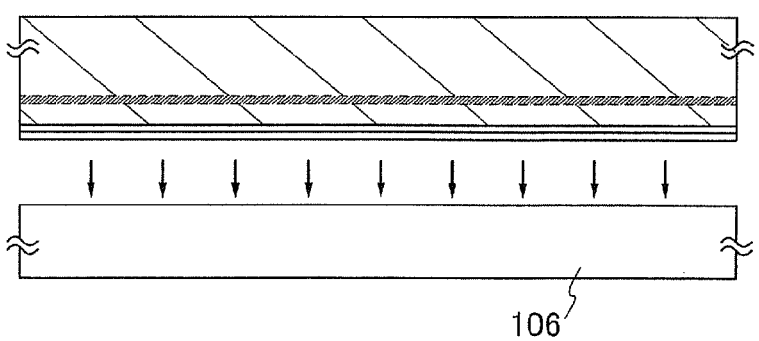
Figure 1E:
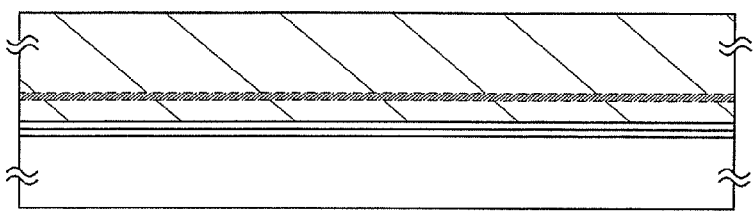

Then, as illustrated in FIGS. 1D and 1E, the semiconductor substrate 101 and the substrate 106 are disposed in close contact with each other and bonded to each other. The substrate 106 is a substrate having an insulating surface or an insulating substrate, and any of a variety of glass substrates that are used in the electronics industry, such as an aluminosilicate glass substrate, an aluminoborosilicate glass substrate, and a barium borosilicate glass substrate, can be used. Surfaces that form a bond are sufficiently cleaned, and then, the semiconductor substrate 101 and the substrate 106 are disposed in close contact with each other, whereby the bond is formed therebetween. This bond is formed by Van der Waals forces. Further, by pressing the semiconductor substrate 101 and the substrate 106 against each other, a stronger bond can be formed by a hydrogen bond.

After the semiconductor substrate 101 and the substrate 106 are bonded to each other, heat treatment or pressure treatment is preferably performed. By the heat treatment or the pressure treatment, bonding strength can be increased. Temperature of the heat treatment is preferably less than or equal to the upper temperature limit of the substrate 106. The pressure treatment is performed such that the pressure is applied in a perpendicular direction to the bonding surfaces, in consideration of pressure resistance of the semiconductor substrate 101 and the substrate 106.

Figure 2A:
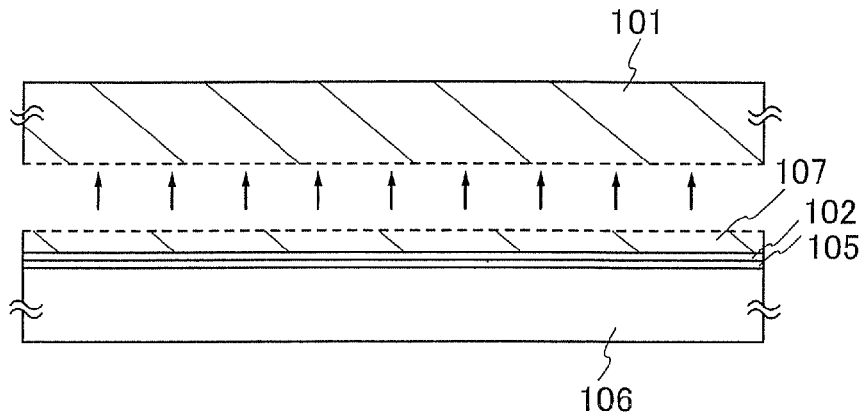
FIGS. 2A to 2D illustrate a method for manufacturing an SOI substrate.

Next, heat treatment is performed as illustrated in FIG. 2A to separate a portion of the semiconductor substrate 101 from the substrate 106 using the brittle layer 104 as a cleavage plane. The heat treatment is preferably performed at greater than or equal to 400° C. and less than or equal to the upper temperature limit of the substrate 106. By performing the heat treatment at, for example, 400 to 600° C. inclusive, the volume of fine voids formed in the brittle layer 104 is changed, so that cleavage can occur along the brittle layer 104. Accordingly, over the substrate 106, the second insulating film 105, the first insulating film 102, and the first semiconductor film 107 which is part of the semiconductor substrate 101 are formed.

The surface of the first semiconductor film 107 over the substrate 106 may be planarized here. As a method for planarizing the surface of the first semiconductor film 107, chemical mechanical polishing (CMP), etching treatment, laser irradiation, or the like can be used.

In addition, the semiconductor substrate 101 which is separated can be reused after the separation surface thereof is planarized and cleaned. As a method for planarizing the separation surface of the semiconductor substrate 101, the same treatment as that for planarizing the surface of the first semiconductor film 107, such as CMP, etching treatment, laser irradiation, or the like, can be used.

Figure 2B:
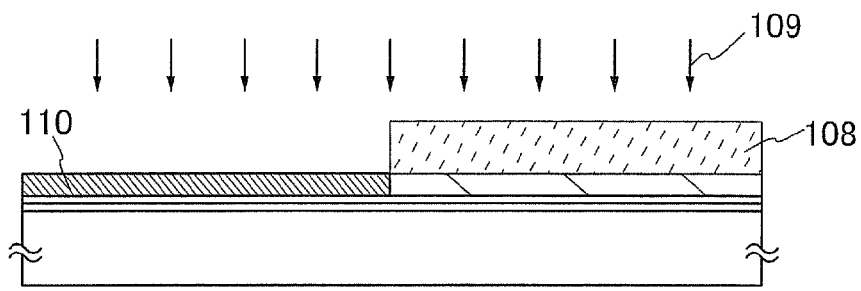

Then, an impurity is implanted into the first semiconductor film 107. First, part of the first semiconductor film 107 is covered with a resist 108, and then, a p-type impurity 109 is implanted into the first semiconductor film 107. As the p-type impurity 109, for example, boron, aluminum, gallium, or the like can be used, and may be added at a concentration of approximately $5 \times 10^{15}$ to $5 \times 10^{17}$ atoms/cm$^3$. Accordingly, as illustrated in FIG. 2B, the p-type impurity 109 is implanted into a region which is not covered with the resist 108 in the first semiconductor film 107, whereby a first semiconductor region 110 into which the p-type impurity 109 is implanted can be formed.

In addition, laser irradiation may be performed here. By the laser irradiation, the impurity which has been added by doping can be diffused in the film.

Figure 2C:
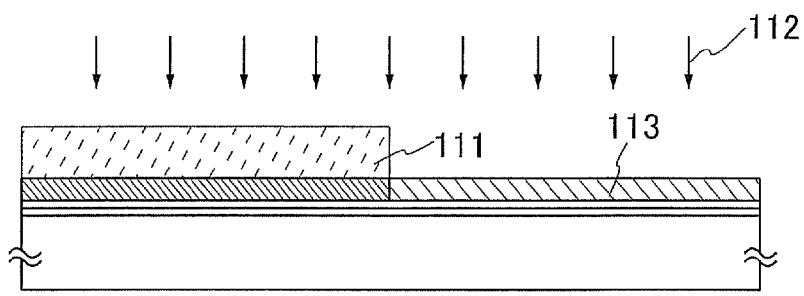

Next, the resist 108 is removed, and another resist 111 is former over the region where the p-type impurity 109 is implanted, and an n-type impurity 112 is implanted into the first semiconductor film 107. As the n-type impurity 112, for example, phosphorus or arsenic can be used and may be added at a concentration of approximately $5 \times 10^{15}$ to $1 \times 10^{16}$ atoms/cm$^3$. Accordingly, as illustrated in FIG. 2C, the n-type impurity 112 is implanted into a region which is not covered with the resist 111 in the first semiconductor film 107, whereby a second semiconductor region 113 into which the n-type impurity 112 is implanted can be formed.

By forming a bottom portion of a channel formation region of a transistor using the first or second semiconductor region 110 or 113 which is formed here, a punch-through current which flows through the bottom portion of the channel formation region can be suppressed. In addition, when the SOI substrate described in Embodiment Mode 1 is used to form a semiconductor device, the first semiconductor region 110 into which the p-type impurity is implanted is used for forming a bottom portion of a channel formation region of an n-channel TFT, and the second semiconductor region 113 into which the n-type impurity is implanted is used to form a bottom portion of a channel formation region of a p-channel TFT. Note that the channel formation regions are each formed in a region which overlaps with a gate electrode and interposed between a source region and a drain region.

Figure 2D:
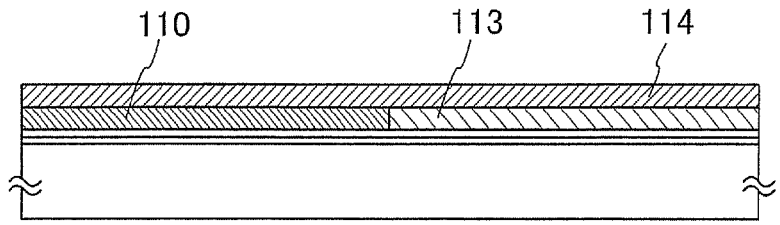

Then, a second semiconductor film 114 which is a single crystal semiconductor film is formed with a thickness of 20 to 250 nm over the first semiconductor film 107 including the first and second semiconductor regions 110 and 113 (FIG. 2D). The second semiconductor film 114 which is a single crystal semiconductor film is formed as follows: a semiconductor film such as a silicon film is deposited over the first semiconductor film 107 by a CVD method under predetermined conditions, and epitaxy (vapor-phase epitaxy) of the semiconductor film is carried out using the first semiconductor film 107 as seed layers.

Alternatively, a single crystal semiconductor film used as the second semiconductor film 114 can be formed as follows: an amorphous semiconductor film (such as an amorphous silicon film) is formed by a plasma CVD method, a low-pressure CVD method, a sputtering method, or the like using silicon, silicon-germanium, or the like as a semiconductor material, heat treatment is performed, and solid-phase epitaxy of the amorphous semiconductor film is carried out. The heat treatment at this time can be performed with a heating furnace, laser irradiation, rapid thermal annealing (RTA), or the combination thereof. That is, an amorphous semiconductor film (such as an amorphous silicon film) may be formed by a CVD method over the first semiconductor film 107 including the first and second semiconductor regions 110 and 113 under predetermined conditions, and heat treatment may be performed with RTA at 500 to 800° C. for 5 to 180 seconds, whereby the semiconductor film 114 which is a single crystal semiconductor film can be formed.

In this manner, the SOI substrate in which the first semiconductor film 107 which is single crystal semiconductor film including the impurities and the second semiconductor film 114 which is a single crystal semiconductor film are stacked over the substrate 106 with the first insulating film 102 and the second insulating film 105 interposed therebetween can be formed.

In the case that a semiconductor device is manufactured using the SOI substrate described in this embodiment mode, an n-channel TFT may be formed using the first semiconductor region 110 including the p-type impurity, and a p-channel TFT may be formed using the second semiconductor region 113 including the n-type impurity.

In manufacturing the SOI substrate according to this embodiment mode, because the semiconductor substrate used for bonding is separated without implanting the impurity or the like thereinto, by performing surface polishing and cleaning of the separation surface, the semiconductor substrate can be reused. In addition, the manufactured SOI substrate has a structure in which the first semiconductor film including the first and second semiconductor regions which are single crystal semiconductor regions each including the impurity imparting one conductivity type and the second semiconductor film that is a single crystal semiconductor film are stacked over the substrate. By using this structure for a channel formation region, a thin film transistor (TFT) which suppresses a punch-through current can be formed, and a semiconductor device including the TFT and the like can be manufactured.

Note that the method for manufacturing the SOI substrate described in this embodiment mode can be combined with manufacturing methods described in other embodiment modes in this specification as appropriate.

Embodiment Mode 2

In Embodiment Mode 2, a method for manufacturing an SOI substrate which is different from that described in Embodiment Mode 1 will be described with reference to FIGS. 3A to 3E and FIGS. 4A to 4C.

Figure 3A:
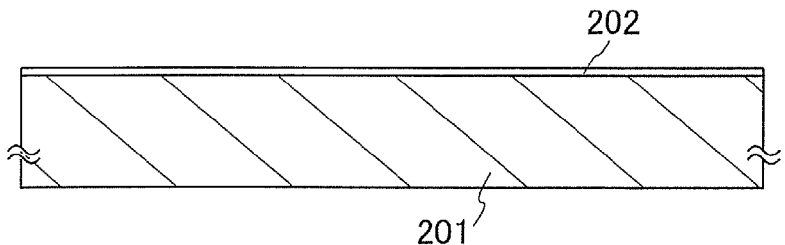
FIGS. 3A to 3E illustrate a method for manufacturing an SOI substrate.

As illustrated in FIG. 3A, a first insulating film 202 is formed over a semiconductor substrate 201. For the semiconductor substrate 201, a p-type or n-type single crystal silicon substrate (silicon wafer) can be used, as a typical example. Alternatively, other crystalline semiconductor substrates such as a substrate of silicon or germanium, a substrate of a compound semiconductor such as gallium arsenide or indium phosphide, and the like can also be used.

The first insulating film 202 can be formed of an insulating material such as silicon oxide, silicon nitride, or silicon including oxygen and nitrogen (silicon oxynitride) by a plasma CVD method, a low-pressure CVD method, a sputtering method, or the like. Alternatively, an oxide film formed by oxidizing the semiconductor substrate 201 can also be used. The first insulating film 202 has a thickness of 10 to 1000 nm (preferably 50 to 200 nm). Further, the first insulating film 202 may have a single layer structure or a stacked layer structure.

In this embodiment mode, a silicon oxide film which is an oxide film of silicon is formed as the first insulating film 202. In the case of forming the oxide film, dry oxidation may be performed, and in that case, it is preferable to add a gas including halogen into an oxidation atmosphere. As the gas including halogen, one or more of HCl, HF, $NF_3$, HBr, Cl, $ClF$, $BCl_3$, F, $Br_2$, and the like can be used. For example, heat treatment is performed at a temperature of greater than or equal to 700° C. in an atmosphere including HCl at 0.5 to 10 vol % (preferably 3 vol %) with respect to oxygen. It is preferable that thermal oxidation be performed at heating temperatures of 950 to 1100° C. inclusive. Treatment time may be 0.1 to 6 hours, preferably 0.5 to 1 hour.

Figure 3B:
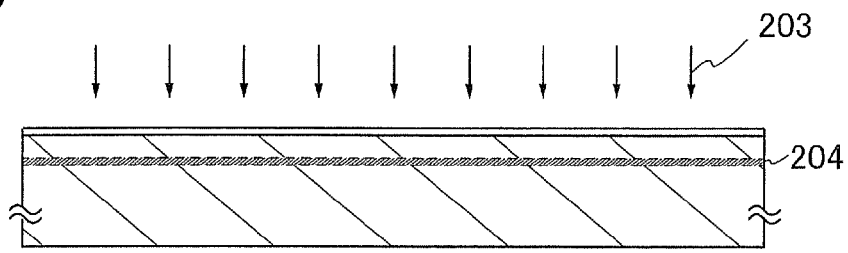

Next, irradiation with ions 203 accelerated by an electric field is performed through the surface of the first insulating film 202 to a predetermined depth, so that a brittle layer 204 is formed (FIG. 3B). The irradiation with the ions 203 is performed in consideration of the thickness of a second semiconductor film 209 which is to be transferred to another substrate. The thickness of the second semiconductor film 209 is 5 to 500 nm inclusive, preferably 10 to 200 nm inclusive. Accelerating voltage for irradiating the semiconductor substrate 201 with the ions is set in consideration of the above thickness.

The brittle layer 204 is formed by irradiation with ions of hydrogen, helium, or halogen typified by fluorine. Note that examples of a method for the irradiation with ions for forming the brittle layer 204 include a so-called ion doping method and ion implantation method. In this case, it is preferable to perform irradiation with one kind of ions or plural kinds of ions of the same atom with different masses. In the case of irradiation with hydrogen ions, it is preferable that the hydrogen ions include $H^+$, $H_2^+$, and $H_3^+$ ions with a high proportion of $H_3^+$ ions. With a high proportion of $H_3^+$ ions, the irradiation efficiency can be increased and irradiation time can be shortened. With this structure, separation can be conducted easily.

Figure 3C:
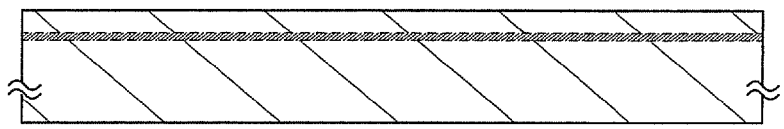
Figure 3D:
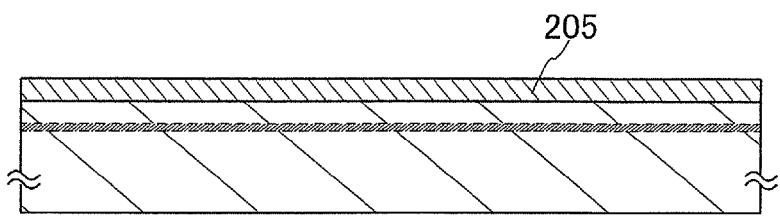

Next, the first insulating film 202 which has been formed is removed by etching (FIG. 3C). Then, over the exposed surface of the semiconductor substrate 201, a first semiconductor film 205 which is an amorphous semiconductor film including an n-type or p-type impurity is formed (FIG. 3D).

Figure 3E:
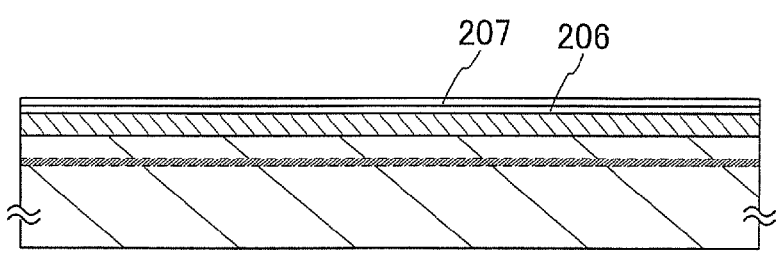

Then, a second insulating film 206 and a third insulating film 207 are formed (FIG. 3E). The second insulating film 206 and the third insulating film 207 can each be formed by a plasma CVD method, a low-pressure CVD method, a sputtering method, or the like by using a silicon oxide film, a silicon nitride film, a silicon oxynitride film, a silicon nitride oxide film, or the like. In this embodiment mode, the second insulating film 206 is formed using a silicon oxide film with a thickness of 50 nm, which is formed by a CVD method using organosilane (TEOS, chemical formula: $Si(OC_2H_5)_4$) as a source gas, whereas the third insulating film 207 is formed using a silicon nitride oxide film with a thickness of 50 nm, which is formed by a plasma CVD method. Here, the insulating film has a two-layer structure including the second insulating film 206 and the third insulating film 207, but the present invention is not limited to the two-layer structure and may employ a multilayer structure including three or more layers.

Figure 4A:
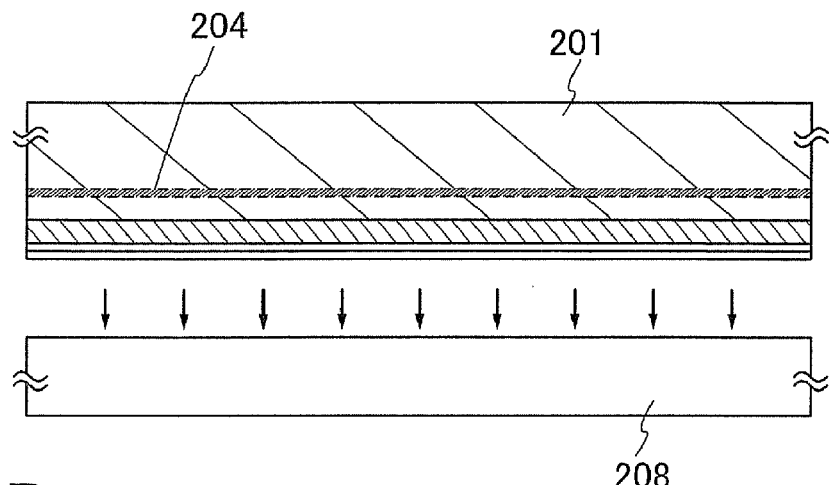
FIGS. 4A to 4C illustrate a method for manufacturing an SOI substrate.

Then, as illustrated in FIG. 4A, the semiconductor substrate 201 and a substrate 208 are disposed in close contact with each other and bonded to each other. The substrate 208 is a substrate having an insulating surface or an insulating substrate, and any of a variety of glass substrates that are used in the electronics industry, such as an aluminosilicate glass substrate, an aluminoborosilicate glass substrate, and a barium borosilicate glass substrate, can be used. Surfaces that form a bond are sufficiently cleaned, and then, the semiconductor substrate 201 and the substrate 208 are disposed in close contact with each other, whereby the bond is formed therebetween. This bond is formed by Van der Waals forces. Further, by pressing the semiconductor substrate 201 and the substrate 208 against each other, a stronger bond can be formed by a hydrogen bond.

After the semiconductor substrate 201 and the substrate 208 are bonded to each other, heat treatment or pressure treatment is preferably performed. By the heat treatment or the pressure treatment, bonding strength can be increased. Temperature of the heat treatment is preferably less than or equal to the upper temperature limit of the substrate 208. The pressure treatment is performed such that the pressure is applied in a perpendicular direction to the bonding surfaces, in consideration of pressure resistance of the semiconductor substrate 201 and the substrate 208.

Figure 4B:
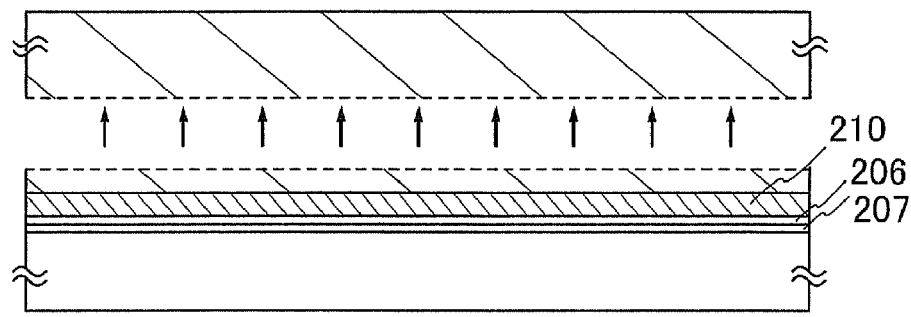

Next, heat treatment is performed on the bonded semiconductor substrate 201 and substrate 208, so that a portion of the semiconductor substrate 201 is separated from the substrate 208 using the brittle layer 204 as a cleavage plane (FIG. 4B). The heat treatment is preferably performed at greater than or equal to 400° C. and less than or equal to the upper temperature limit of the substrate 208. By performing the heat treatment at, for example, 400 to 600° C. inclusive, the volume of fine voids formed in the brittle layer 204 is changed, so that cleavage can occur along the brittle layer 204. Further, in this embodiment mode, epitaxy (solid-phase epitaxy) of the first semiconductor film 205 which is an amorphous semiconductor film and has been formed in advance can be carried out in this heat treatment, so that the first semiconductor film 205 can become a single crystal semiconductor film 210.

The surface of the second semiconductor film 209 over the substrate 208 may be planarized here. As a method for planarizing the surface of the second semiconductor film 209, chemical mechanical polishing (CMP), etching treatment, laser irradiation, or the like can be used.

The semiconductor substrate 201 which is separated can be reused after the separation surface thereof is planarized and cleaned. As a method for planarizing the separation surface of the semiconductor substrate 201, the same treatment as that for planarizing the surface of the second semiconductor film 209, such as CMP, etching treatment, laser irradiation, or the like can be used.

Figure 4C:
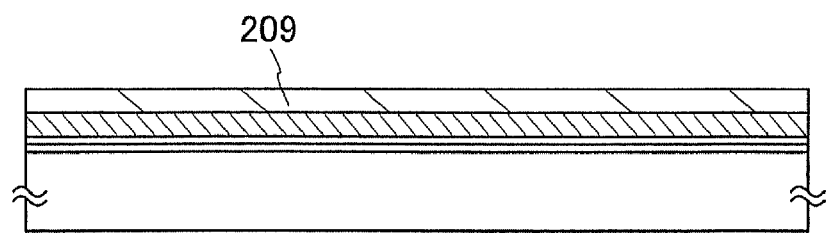

In this manner, over the substrate 208, the third insulating film 207, the second insulating film 206, the single crystal semiconductor film 210, and the second semiconductor film 209 which is part of the semiconductor substrate 201 can be formed (FIG. 4C).

In the case that a semiconductor device is manufactured using the SOI substrate described in this embodiment mode, an n-channel TFT may be formed when the single crystal semiconductor film 210 includes a p-type impurity, whereas a p-channel TFT may be formed when the single crystal semiconductor film 210 includes an n-type impurity.

In manufacturing the SOI substrate according to this embodiment mode, because the semiconductor substrate used for bonding is separated without implanting an impurity or the like thereinto, by performing surface polishing and cleaning of the separation surface, the semiconductor substrate can be reused. In addition, the manufactured SOI substrate has a structure in which the first semiconductor film that is a single crystal semiconductor film including the impurity imparting one conductivity type and the second semiconductor film that is a single crystal semiconductor film are stacked over the substrate. By using this structure for a channel formation region, a thin film transistor (TFT) which suppresses a punch-through current can be formed, and a semiconductor device including the TFT and the like can be manufactured.

Note that the method for manufacturing the SOI substrate described in this embodiment mode can be combined with manufacturing methods described in other embodiment modes in this specification as appropriate.

Embodiment Mode 3

In Embodiment Mode 3, a method for manufacturing a semiconductor device, by using the SOI substrate described in Embodiment Mode 1, will be described with reference to FIGS. 5A to 5D, FIGS. 6A to 6D, and FIGS. 7A and 7B. Therefore, the reference numerals in FIGS. 1A to 1E and FIGS. 2A to 2D are used in common also in FIGS. 5A to 5D, FIGS. 6A to 6D, and FIGS. 7A and 7B.

Figure 5A:
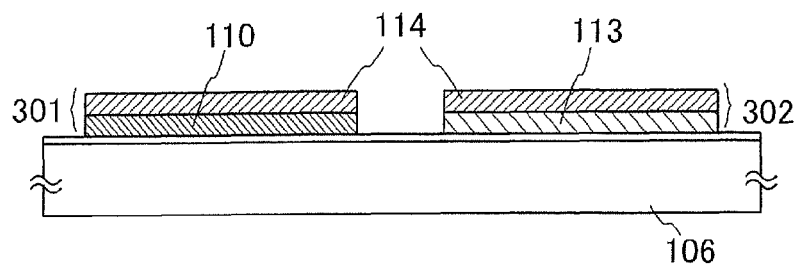
FIGS. 5A to 5D illustrate a method for manufacturing a semiconductor device.
Figure 5B:
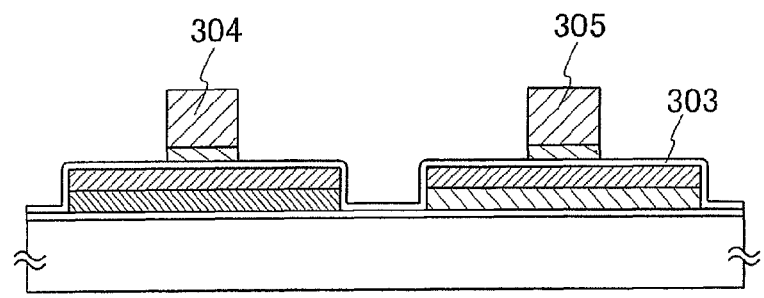

The first semiconductor film 107 including the first and second semiconductor regions 110 and 113 and the second semiconductor film 114 formed over the substrate 106 illustrated in FIG. 2D are etched to form stacked semiconductor films 301 and 302 which are separated into island shapes in accordance with arrangement of semiconductor elements (FIG. 5A). Then, as illustrated in FIG. 5B, a gate insulating film 303 is formed. The gate insulating film 303 is formed to have a thickness of 5 to 50 nm inclusive. The gate insulating film 303 is preferably formed using a silicon oxide film or a silicon oxynitride film.

In this embodiment mode, the gate insulating film 303 is formed by a vapor deposition method. In the case of forming the gate insulating film 303 with good quality at a temperature of less than or equal to 450° C., a plasma CVD method is preferably used. In particular, it is preferable to use a microwave plasma CVD method with an electron density of $1 \times 10^{11}$ to $1 \times 10^{13}$ cm$^{-3}$ inclusive and electron temperatures of approximately 0.2 to 2.0 eV inclusive (more preferably, 0.5 to 1.5 eV inclusive). When plasma with high electron density and low electron temperature and low kinetic energy of an active species is utilized, a film with less plasma damage in which defects are reduced can be formed.

After the gate insulating film 303 is formed, gate electrodes 304 and 305 are formed (FIG. 5B). As a material for forming the gate electrodes 304 and 305, for example, a metal element such as Ag, Au, Cu, Ni, Pt, Pd, Ir, Rh, W, Al, Ta, Mo, Cd, Zn, Fe, Ti, Si, Ge, Zr, Ba, or Nd, an alloy material including the metal element as its main component, a compound material such as metal nitride including the metal element, or a material including two or more of the above materials can be used.

Figure 5C:
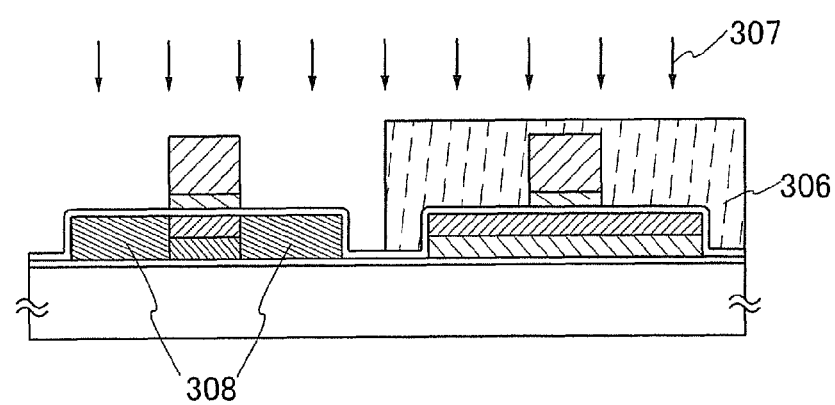
Figure 5D:
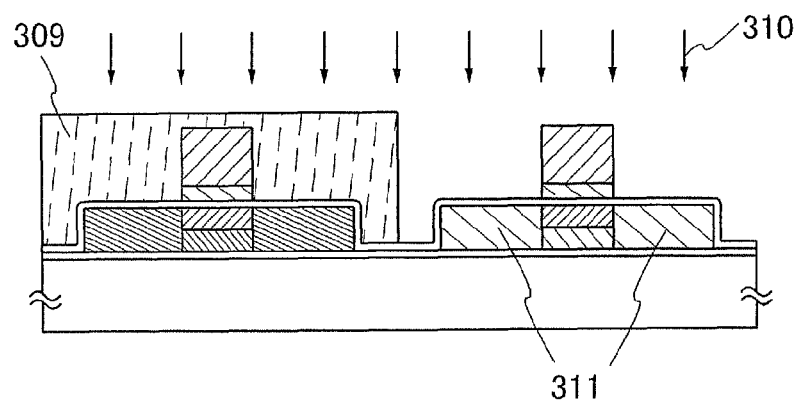

Then, a resist 306 is formed and an n-type impurity 307 is implanted, thereby forming first impurity regions 308 (FIG. 5C). Further, after the resist 306 is removed, a resist 309 is formed and a p-type impurity 310 is implanted, thereby forming second impurity regions 311 (FIG. 5D).

The first impurity regions 308 formed here function as a source region and a drain region of an n-channel transistor. The first impurity regions 308 are formed by adding phosphorus or arsenic, which is the n-type impurity 307, at a peak concentration of $1\times10^{18}$ to $1\times10^{20}$ atoms/cm$^3$. Further, the second impurity regions 311 function as a source region and a drain region of a p-channel transistor. The second impurity regions 311 are formed by adding boron, aluminum, gallium, or the like, which is the p-type impurity 310, at a peak concentration of $1\times10^{18}$ to $1\times10^{20}$ atoms/cm$^3$.

Figure 6A:
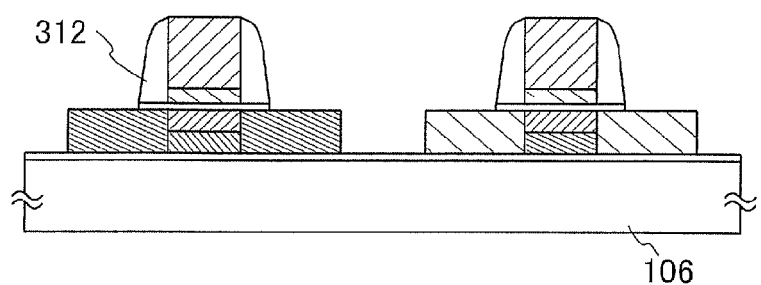
FIGS. 6A to 6D illustrate a method for manufacturing a semiconductor device.
Figure 6B:
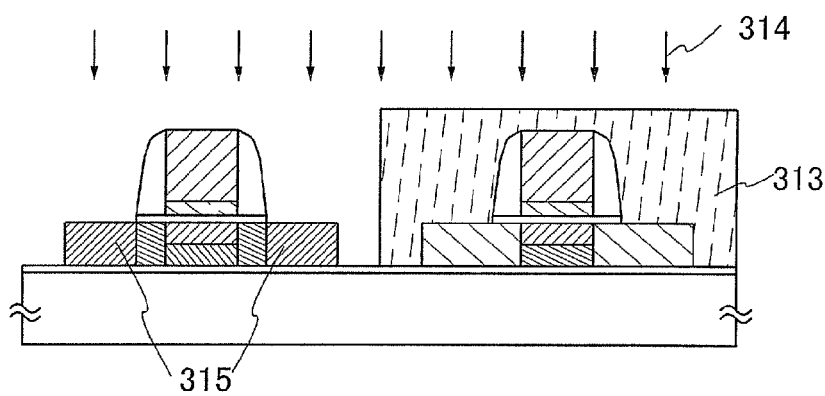
Figure 6C:
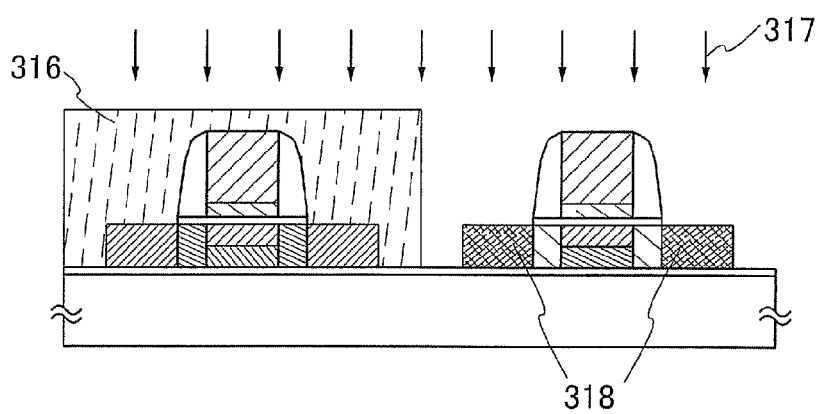

Next, sidewall insulating layers 312 are formed (FIG. 6A). Then, a resist 313 is formed and an n-type impurity 314 is implanted, thereby forming third impurity regions 315 (FIG. 6B). The third impurity regions 315 are formed by adding phosphorus or arsenic, which is the n-type impurity 314, at a peak concentration of $1\times10^{19}$ to $1\times10^{20}$ atoms/cm$^3$. Further, after the resist 313 is removed, a resist 316 is formed and a p-type impurity 317 is implanted, thereby forming fourth impurity regions 318 (FIG. 6C). The fourth impurity regions 318 are formed by adding boron, aluminum, gallium, or the like, which is the p-type impurity 317, at a peak concentration of $1\times10^{19}$ to $5\times10^{21}$ atoms/cm$^3$.

Figure 6D:
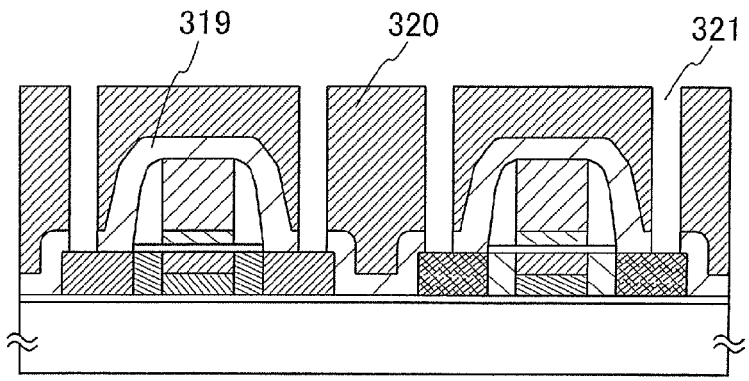

After the resist 316 is removed, a protective film 319 is formed. As the protective film 319, a silicon nitride film or a silicon nitride oxide film can be used. An interlayer insulating film 320 is formed over the protective film 319. As the interlayer insulating film 320, in addition to an inorganic insulating film formed of silicon oxide, silicon nitride, silicon nitride oxide, silicon oxynitride, or the like, a borophosphosilicate glass (BPSG) film or an organic resin film typified by a polyimide film can be used. Further, contact holes 321 are formed in the interlayer insulating film 320 (FIG. 6D).

Figure 7A:
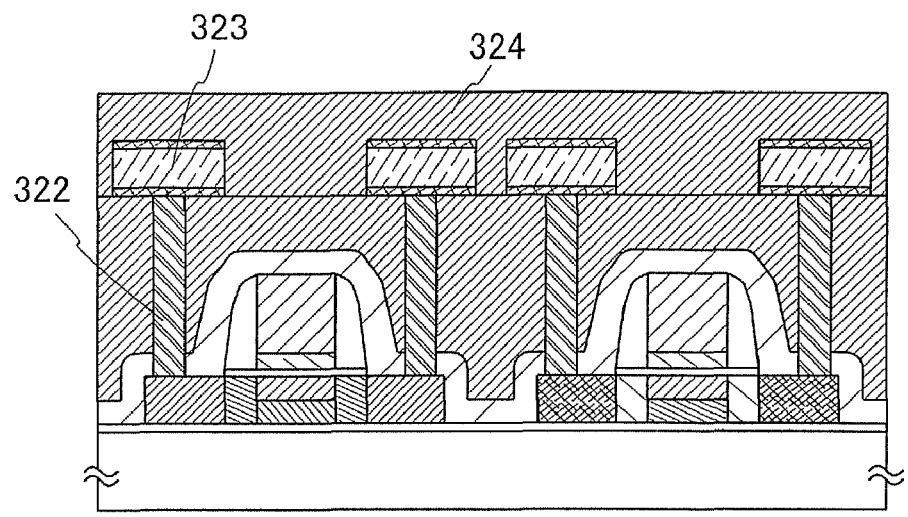
FIGS. 7A and 7B illustrate a method for manufacturing a semiconductor device.

Then, formation of wirings is described. As illustrated in FIG. 7A, in the contact holes 321, contact plugs 322 are formed. The contact plugs 322 are formed with tungsten silicide by a chemical vapor deposition method using a WF$_6$ gas and a SiH$_4$ gas so as to fill the contact holes 321. Alternatively, tungsten may be deposited by hydrogen reduction of WF$_6$ to fill the contact holes 321. After that, wirings 323 are formed so as to be connected to the contact plugs 322. The wirings 323 are formed using aluminum or an aluminum alloy, and have a barrier metal formed of a metal film such as molybdenum, chromium, or titanium as upper and lower layers. Furthermore, an interlayer insulating film 324 is formed thereover. The wirings may be provided as appropriate, and multilayer wirings may be formed by further forming wiring layers over the interlayer insulating film 324. In that case, a damascene process may be employed.

Figure 7B:
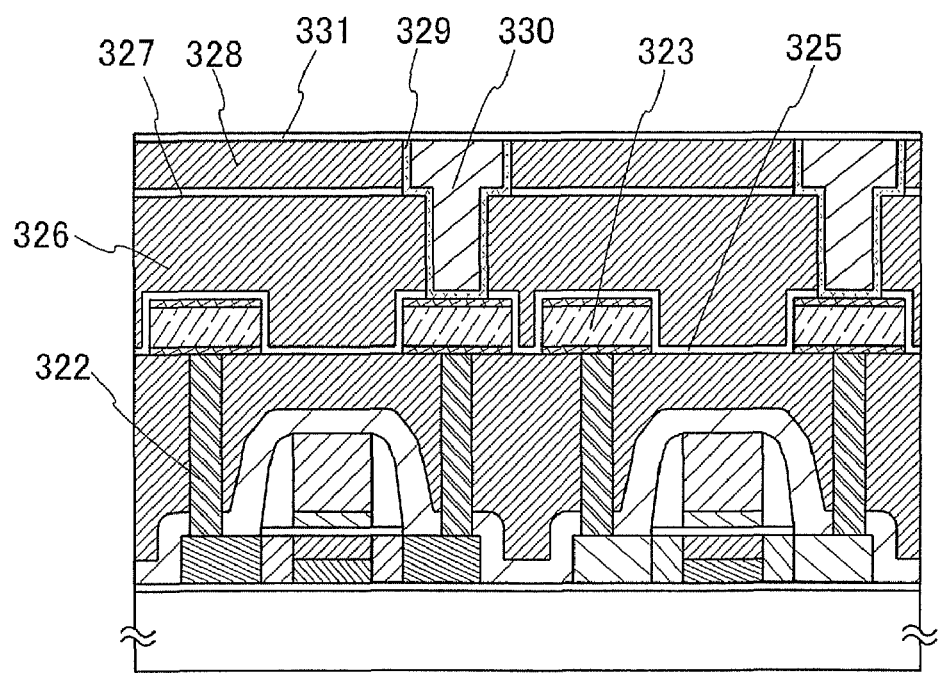

FIG. 7B illustrates a mode in which multilayer wirings are formed by forming upper wirings over the wirings 323. A passivation film 325 is formed using a silicon nitride film over the wirings 323, and an interlayer insulating film 326 is provided. Further, a passivation film 327 and an insulating film 328 between wirings is formed. The upper wirings can be formed by, for example, a damascene process or a dual-damascene process. Barrier metals 329 are formed using tantalum or tantalum nitride and copper wirings 330 are formed by a plating method and embedded in the insulating film 328 between the wirings by a chemical mechanical polishing (CMP) method. A passivation film 331 is formed of silicon nitride thereover. The number of layers stacked as wirings is not determined and may be selected as appropriate.

As described above, thin film transistors can be manufactured using the SOI substrate in which the first semiconductor film which is a single crystal semiconductor film to which the impurities are added and the second semiconductor film which is a single crystal semiconductor film are stacked.

In each of the thin film transistors according to this embodiment mode, a channel formation region is formed using the semiconductor film in which the first and second semiconductor films each comprising single crystal semiconductor film are stacked. By implanting the impurity (the n-type impurity or the p-type impurity) imparting a conductivity type opposite to that of the source region and the drain region into the first or second semiconductor region 110 or 113 which is provided on the back channel side (the side opposite to the gate electrode 304 or 305) of the channel formation region, a punch-through current which flows through the bottom portion of the channel formation region of the transistor can be suppressed. Therefore, a transistor with sharp subthreshold characteristics and excellent switching characteristics can be obtained. Further, the second semiconductor film 114 forming the channel formation region is a single crystal semiconductor that has uniform crystal orientation; therefore, it is possible to suppress inhomogeneity of values of important transistor characteristics, such as threshold voltage and mobility, and to achieve high performance such as high mobility.

Embodiment Mode 4

Figure 8:
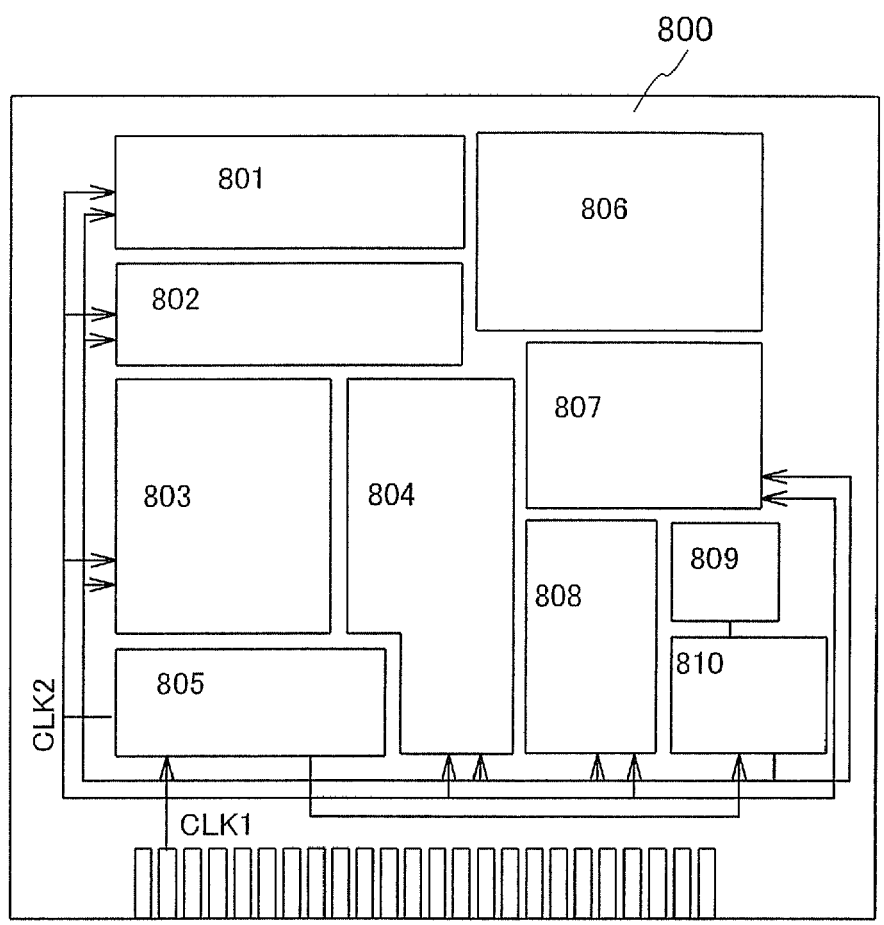
FIG. 8 is a block diagram illustrating a configuration of a microprocessor.

In Embodiment Mode 4, as an example of the semiconductor device described in Embodiment Mode 3, a microprocessor will be described with reference to FIG. 8.

A microprocessor 800 includes an arithmetic logic unit (also referred to as an ALU) 801, an ALU controller 802, an instruction decoder 803, an interrupt controller 804, a timing controller 805, a register 806, a register controller 807, a bus interface (Bus I/F) 808, a read-only memory 809, and a memory interface (ROM I/F) 810.

An instruction input to the microprocessor 800 through the bus interface 808 is input to the instruction decoder 803, decoded therein, and then input to the ALU controller 802, the interrupt controller 804, the register controller 807, and the timing controller 805. The ALU controller 802, the interrupt controller 804, the register controller 807, and the timing controller 805 perform various controls based on the decoded instruction.

Specifically, the ALU controller 802 generates a signal for controlling the operation of the ALU 801. While the microprocessor 800 is executing a program, the interrupt controller 804 processes an interrupt request from an external input/output device or a peripheral circuit based on its priority or a mask state. The register controller 807 generates an address of the register 806, and reads/writes data from/to the register 806 in accordance with the state of the microprocessor 800. The timing controller 805 generates signals for controlling timing of the operations of the ALU 801, the ALU controller 802, the instruction decoder 803, the interrupt controller 804, and the register controller 807. For example, the timing controller 805 is provided with an internal clock generator for generating an internal clock signal CLK2 based on a reference clock signal CLK1, and supplies the internal clock signal CLK2 to the above various circuits. Note that the microprocessor 800 illustrated in FIG. 8 is just an example in which the configuration is simplified, but an actual microprocessor can have various configurations depending on the uses.

In a semiconductor element included in such a microprocessor, a channel formation region is formed of a semiconductor film in which a first semiconductor film and a second semiconductor film are stacked. By implanting an impurity (an n-type impurity or a p-type impurity) imparting a conductivity type opposite to that of a source region and a drain region into the first semiconductor film which is provided on the back channel side (the side opposite to a gate electrode) of the channel formation region, a punch-through current which flows through a bottom portion of the channel formation region of the transistor can be suppressed. Therefore, switching characteristics can be improved. Further, the second semiconductor film forming the channel formation region is a single crystal semiconductor that has uniform crystal orientation; therefore, it is possible to suppress inhomogeneity of values of characteristics, such as threshold voltage and mobility, and to achieve high performance such as high mobility.

Note that in Embodiment Mode 4, the structures described in Embodiment Modes 1 to 3 can be freely combined.

Embodiment Mode 5

Figure 9:
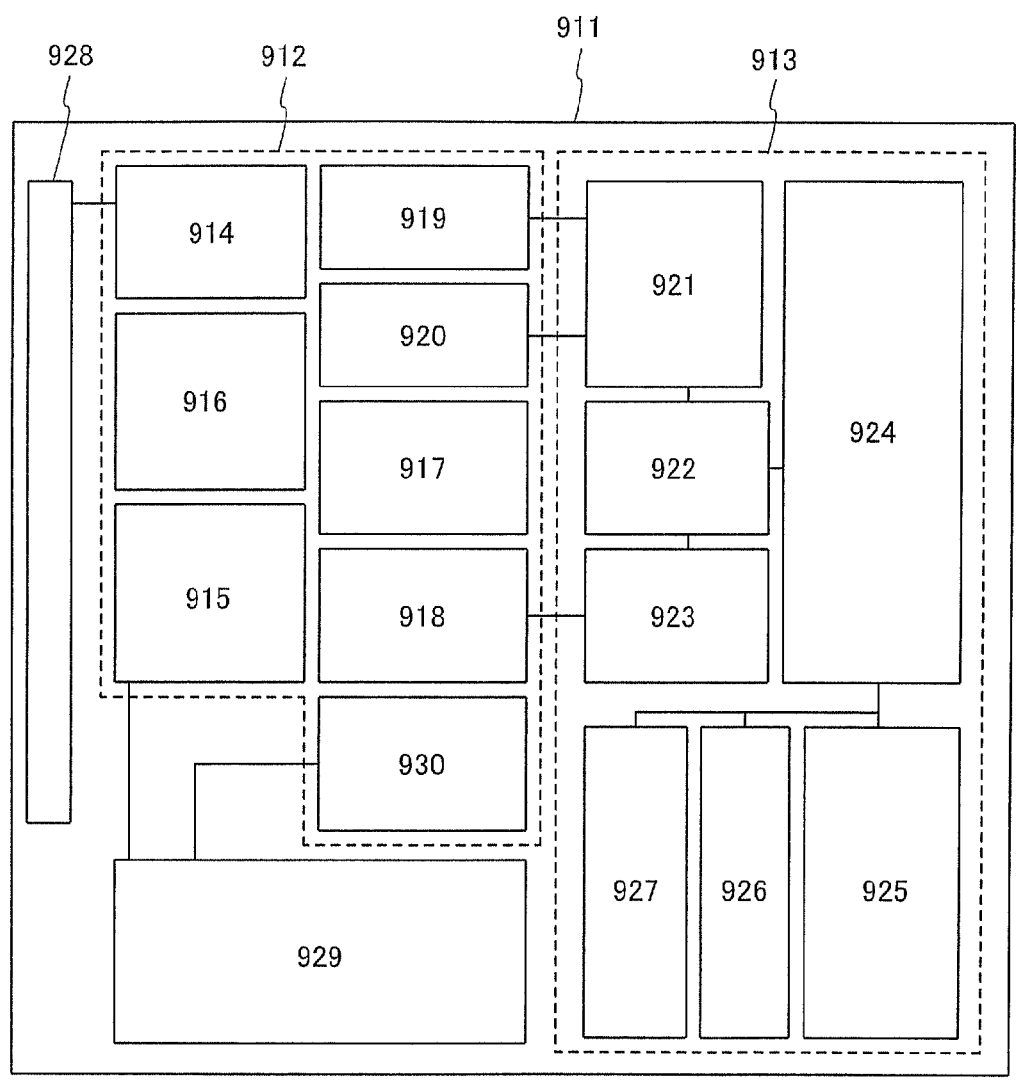
FIG. 9 is a block diagram illustrating a configuration of an RFCPU.

In Embodiment Mode 5, as an example of the semiconductor device described in Embodiment Mode 3, a semiconductor device having an arithmetic function, which is capable of transmitting and receiving data without contact, will be described FIG. 9 illustrates an example of a computer that operates to transmit/receive signals to/from an external device by wireless communication (such a computer is hereinafter referred to as an RFCPU). An RFCPU 911 has an analog circuit portion 912 and a digital circuit portion 913. The analog circuit portion 912 includes a resonance circuit 914 having a resonant capacitor, a rectifier circuit 915, a constant voltage circuit 916, a reset circuit 917, an oscillation circuit 918, a demodulation circuit 919, and a modulation circuit 920. The digital circuit portion 913 includes an RF interface 921, a control register 922, a clock controller 923, a CPU interface 924, a central processing unit (CPU) 925, a random-access memory (RAM) 926, and a read-only memory (ROM) 927.

The operation of the RFCPU 911 having such a configuration is as follows. The resonance circuit 914 generates an induced electromotive force based on a signal received by an antenna 928. The induced electromotive force is stored in a capacitor portion 929 via the rectifier circuit 915. This capacitor portion 929 is preferably formed using a capacitor such as a ceramic capacitor or an electric double layer capacitor. The capacitor portion 929 is not necessarily formed over the same substrate as the RFCPU 911 and may be mounted as another component on a substrate having an insulating surface that partially constitutes the RFCPU 911.

The reset circuit 917 generates a signal for resetting and initializing the digital circuit portion 913. For example, the reset circuit 917 generates a signal which rises after the rise in the power supply voltage with delay, as a reset signal. The oscillation circuit 918 changes the frequency and the duty ratio of a clock signal in accordance with a control signal generated by the constant voltage circuit 916. The demodulation circuit 919 having a low pass filter, for example, binarizes amplitude fluctuation of an amplitude shift keying (ASK) reception signal. The modulation circuit 920 changes the amplitude of an amplitude shift keying (ASK) transmission signal to transmit data. The modulation circuit 920 changes the amplitude of a communication signal by changing a resonance point of the resonance circuit 914. The clock controller 923 generates a control signal for changing the frequency and the duty ratio of a clock signal in accordance with the power supply voltage or a consumption current of the central processing unit 925. The power supply voltage is controlled by a power supply control circuit 930.

A signal that is input to the RFCPU 911 via the antenna 928 is demodulated by the demodulation circuit 919, and then divided into a control command, data, and the like by the RF interface 921. The control command is stored in the control register 922. The control command includes reading of data stored in the read-only memory 927, writing of data to the random access memory 926, an arithmetic instruction to the central processing unit 925, and the like. The central processing unit 925 accesses the read-only memory 927, the random access memory 926, and the control register 922 via the CPU interface 924. The CPU interface 924 has a function of generating an access signal for any of the read-only memory 927, the random access memory 926, and the control register 922, based on an address requested by the central processing unit 925.

As an arithmetic method of the central processing unit 925, a method may be employed in which the read-only memory 927 stores an operating system (OS) and a program is read and executed at the time of starting operation. Alternatively, a method may be employed in which a circuit dedicated to arithmetic is formed and an arithmetic process is conducted using hardware. As for a method in which both hardware and software are used, a method can be employed in which part of arithmetic process is conducted in the circuit dedicated to arithmetic and the other part of the arithmetic process is conducted by the central processing unit 925 using a program.

The RFCPU 911 like this can achieve not only increase in processing speed but also reduction in power consumption because an integrated circuit is formed using a single crystal semiconductor layer with uniform crystal orientation which is bonded to a substrate having an insulating surface or an insulating substrate. This makes it possible to ensure the operation for a long period even when the capacitor portion 929 which supplies electric power is downsized. Although FIG. 9 illustrates a mode of the RFCPU, the semiconductor device may be an IC tag or the like as long as it has a communication function, an arithmetic processing function, and a memory function.

In the RFCPU described in Embodiment Mode 5, the integrated circuit is formed using a semiconductor film in which a first semiconductor film into which an impurity (an n-type impurity or a p-type impurity) imparting a conductivity type opposite to that of a source region and a drain region is implanted and a second semiconductor film formed of a single crystal semiconductor with uniform crystal orientation are stacked. Therefore, a punch-through current which flows through a bottom portion of a channel formation region can be suppressed, whereby the RFCPU can achieve improvement in switching characteristics, and furthermore, increase in processing speed and reduction in power consumption.

Note that in Embodiment Mode 5, the structures described in Embodiment Modes 1 to 4 can be freely combined.

Embodiment Mode 6

In Embodiment Mode 6, a large-sized glass substrate called mother glass for manufacturing display panels is employed as a substrate which is used in forming a semiconductor device by the present invention.

Figure 10A:
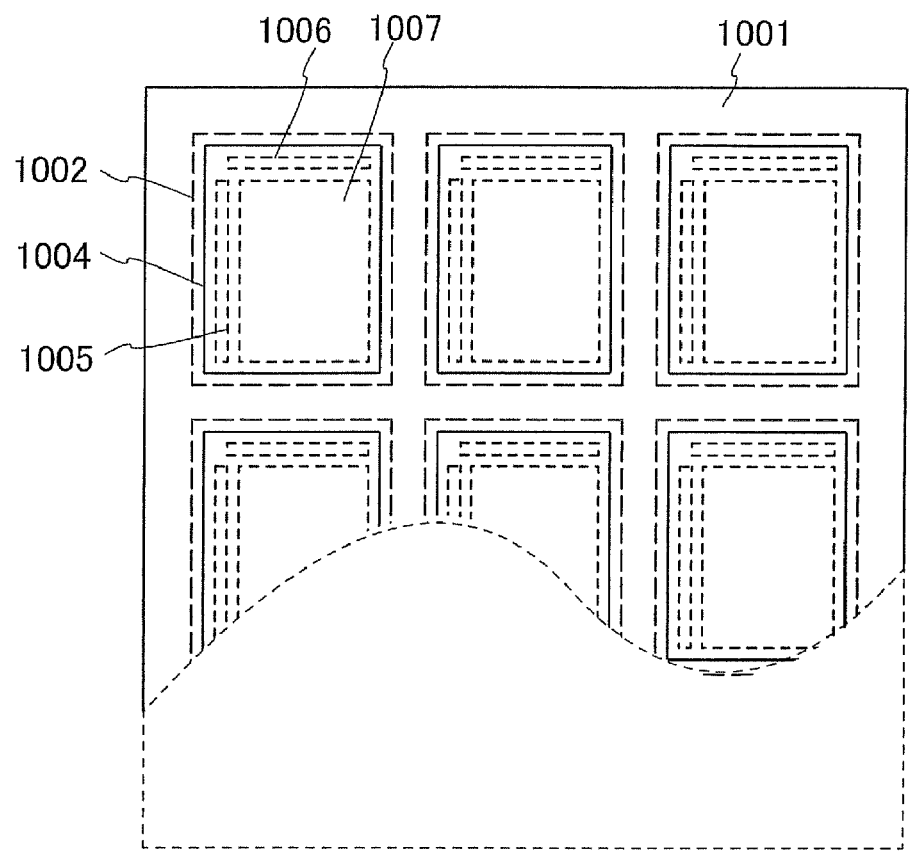
FIGS. 10A and 10B illustrate a mode in which a single crystal semiconductor film is bonded to a large-sized substrate.
Figure 10B:
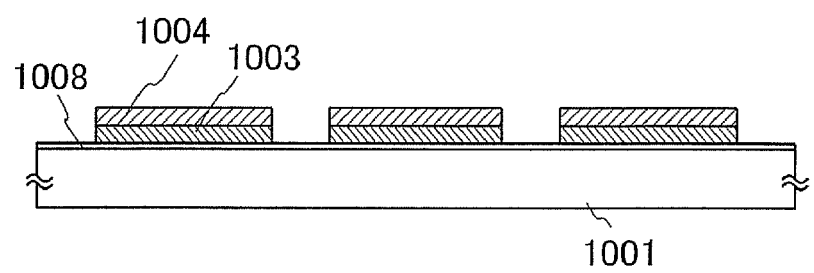

As illustrated in FIGS. 10A and 10B, a plurality of display panels 1002 are formed over mother glass that is a substrate 1001. It is preferable that, after a semiconductor substrate is bonded to each formation region of display panels 1002 and at least one semiconductor film (a first semiconductor film 1003 or both of a first semiconductor film 1003 and a second semiconductor film 1004) is formed, the plurality of display panels 1002 are cut out from the mother glass 1001. Since a mother glass substrate has a larger area than the semiconductor substrate, it is preferable that the semiconductor film (the first semiconductor film 1003 or both of the first semiconductor film 1003 and the second semiconductor film 1004) be arranged within the formation region of each display panel 1002, as illustrated in FIG. 10A. Accordingly, even if a plurality of the second semiconductor films 1004 are arranged over the substrate 1001, sufficient spaces can be provided between adjacent second semiconductor films 1004.

Each of the display panels 1002 includes a scan line driver circuit region 1005, a signal line driver circuit region 1006, and a pixel formation region 1007. The second semiconductor film 1004 is bonded to the substrate 1001 so as to include these regions.

FIG. 10B is a cross-sectional view of FIG. 10A. The semiconductor films formed over the substrate 1001 could be contaminated by diffusion of impurities such as sodium from the substrate 1001 that is a large-sized glass substrate; therefore, an insulating film 1008 functioning as a barrier film is preferably formed over the substrate 1001 as illustrated in FIG. 10B.

Figure 11A:
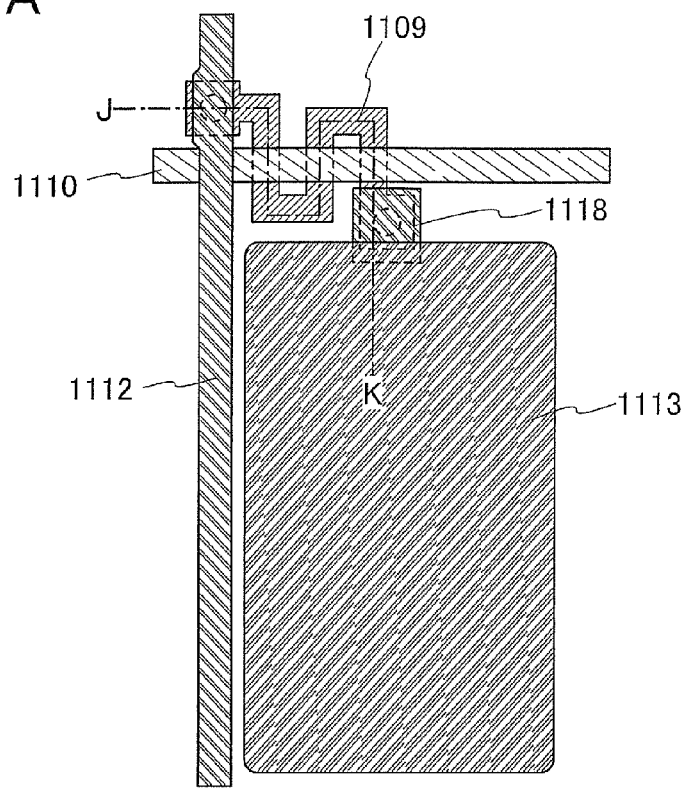
FIGS. 11A and 11B illustrate an example of a liquid crystal display device.
Figure 11B:
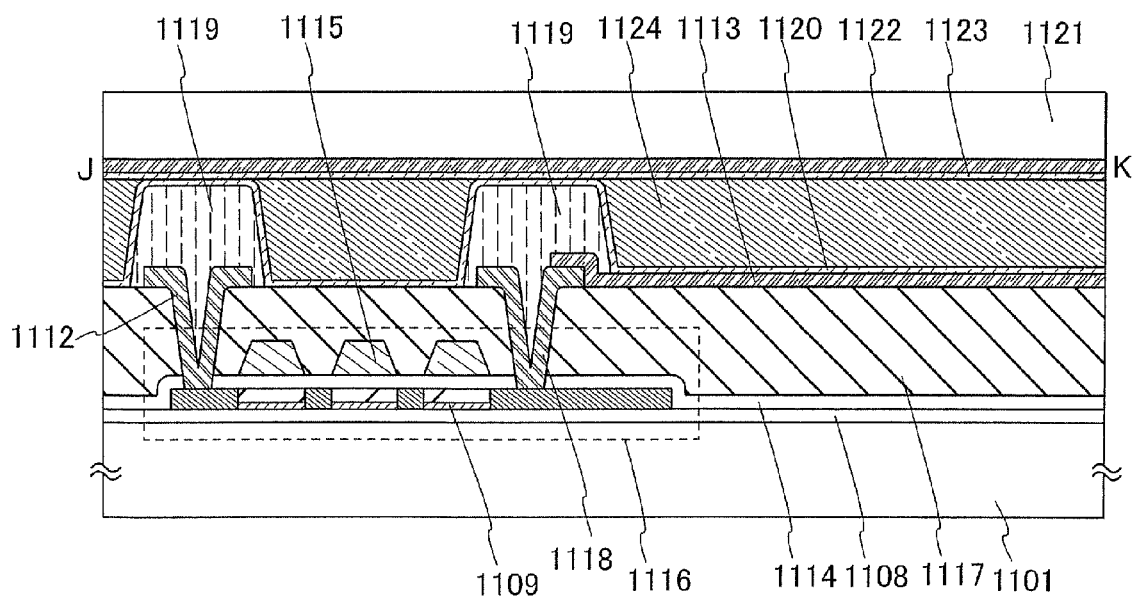

In this embodiment mode, in addition to the SOI substrate illustrated in FIGS. 10A and 10B, a liquid crystal display device will be described as an example of a display device manufactured using such an SOI substrate with reference to FIGS. 11A and 11B. FIG. 11A is a plan view of a pixel of the liquid crystal display device. A scan line 1110 intersects with a semiconductor film 1109 having a stacked layer structure in which a single crystal semiconductor film is formed over a semiconductor film including an n-type or p-type impurity, and a signal line 1112 and a pixel electrode 1113 are connected to the semiconductor film 1109. FIG. 11B is a cross-sectional view taken along line J-K in FIG. 11A.

In FIG. 11B, there is a region where an insulating film 1108, the semiconductor film 1109 having a stacked layer structure of the single crystal semiconductor film including the n-type or p-type impurity and the single crystal semiconductor film, a gate insulating film 1114, and gate electrodes 1115 are stacked over a substrate 1101. A pixel transistor 1116 is formed to include such a region.

Further, the signal line 1112, the pixel electrode 1113, and an electrode 1118 are provided over an interlayer insulating film 1117. Columnar spacers 1119 are formed over the interlayer insulating film 1117, and an alignment film 1120 is formed to cover the signal line 1112, the pixel electrode 1113, the electrode 1118, and the columnar spacers 1119. A counter substrate 1121 is provided with a counter electrode 1122 and an alignment film 1123 which covers the counter electrode 1122. The columnar spacers 1119 are formed to keep a gap between the substrate 1101 and the counter substrate 1121. A liquid crystal layer 1124 is formed in a space formed by the columnar spacers 1119. At portions where the semiconductor film 1109 is connected to the signal line 1112 and the electrode 1118, gaps are generated in the interlayer insulating film 1117 by formation of contact holes. The columnar spacers 1119 are provided so as to fill the gaps. Accordingly, disorder in the orientation of liquid crystals in the liquid crystal layer 1124 due to the gaps can be prevented.

Figure 12A:
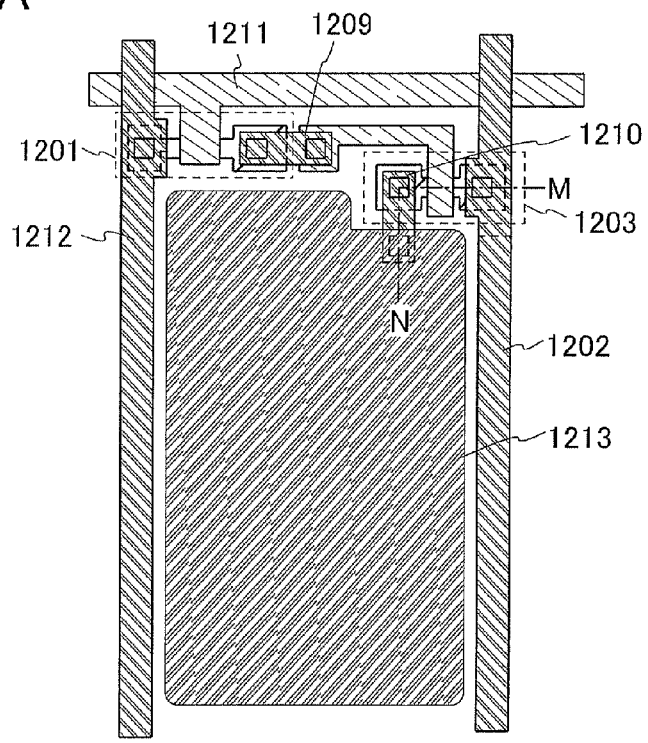
FIGS. 12A and 12B illustrate an example of an electroluminescent display device.
Figure 12B:
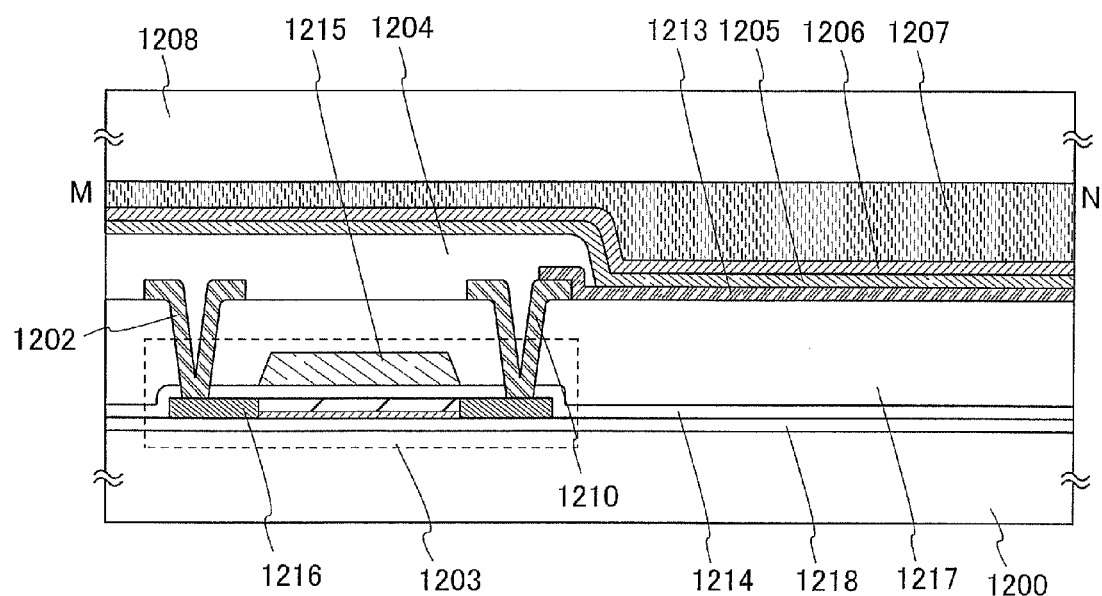

Further, in this embodiment mode, an electroluminescent display device (hereinafter also referred to as an EL display device) will be described with reference to FIGS. 12A and 12B, in addition to the liquid crystal display device illustrated in FIGS. 11A and 11B. FIG. 12A is a plan view of a pixel of the EL display device, which includes a selection transistor 1201 which connects to a signal line 1212 and a display control transistor 1203 which connects to a current supply line 1202. In addition, a scan line 1211 is electrically connected to a gate electrode of the selection transistor 1201. This display device has a structure in which each pixel is provided with a light-emitting element that has a layer (EL layer) formed to include an electroluminescent material between a pair of electrodes. One electrode of the light-emitting element is a pixel electrode 1213, which is connected to the display control transistor 1203. FIG. 12B is a cross-sectional view illustrating a main part of the pixel.

In FIG. 12B, there is a region where an insulating film 1218, a semiconductor film 1216 having a stacked layer structure of a single crystal semiconductor film including an n-type or p-type impurity and a single crystal semiconductor film, a gate insulating film 1214, and a gate electrode 1215 are stacked over a substrate 1200. Each of the selection transistor 1201 and the display control transistor 1203 is formed to include such a region.

Further, an interlayer insulating film 1217 is formed to cover the gate electrode 1215 of the display control transistor 1203. The signal line 1212 (not shown in FIG. 12B), the current supply line 1202, electrodes 1209 (not shown in FIG. 12B) and 1210, and the like are formed over the interlayer insulating film 1217. Further, the pixel electrode 1213 which is electrically connected to the electrode 1210 is formed over the interlayer insulating film 1217. A peripheral portion of the pixel electrode 1213 is surrounded by an insulating partition layer 1204. An EL layer 1205 is formed over the pixel electrode 1213. Over the EL layer 1205, a counter electrode 1206 is formed. The pixel portion is filled with a sealing resin 1207 and is provided with a counter substrate 1208 as a reinforcing plate.

Each of the above-described display devices (the liquid crystal display device and the electroluminescent display device) is formed to include a semiconductor element. The semiconductor element has a channel formation region formed of a semiconductor film in which a first semiconductor film which is a single crystal semiconductor film and to which an impurity (an n-type impurity or a p-type impurity) imparting a conductivity type opposite to that of a source region and a drain region is implanted and a second semiconductor film which is a single crystal semiconductor are stacked. The first semiconductor film is provided on the back channel side (the side opposite to the gate electrode) of the channel formation region. Therefore, a punch-through current which flows through a bottom portion of the channel formation region of the transistor can be suppressed, and switching characteristics can be improved and the reliability can be enhanced. As a result, high-quality display can be achieved.

Note that in Embodiment Mode 6, the structures described in Embodiment Modes 1 to 5 can be freely combined.

Embodiment Mode 7

In this embodiment mode, examples of various electronic appliances will be described with reference to FIGS. 13A to 13F. The examples of the electronic appliances include: television devices (also referred to as simply, televisions or television receivers), cameras such as video cameras and digital cameras, goggle type displays (head mounted displays), navigation systems, audio reproducing devices (e.g., car audio component stereos and audio component stereos), laptop personal computers, game machines, portable information terminals (e.g., mobile computers, mobile phones, portable game machines, and electronic book readers), image reproducing devices provided with recording media (specifically, the devices that can reproduce a recording medium such as a digital versatile disc (DVD) and are provided with a display device capable of displaying the reproduced images), and the like. Preferred modes thereof will be described with reference to FIGS. 13A to 13F.

Figure 13A:
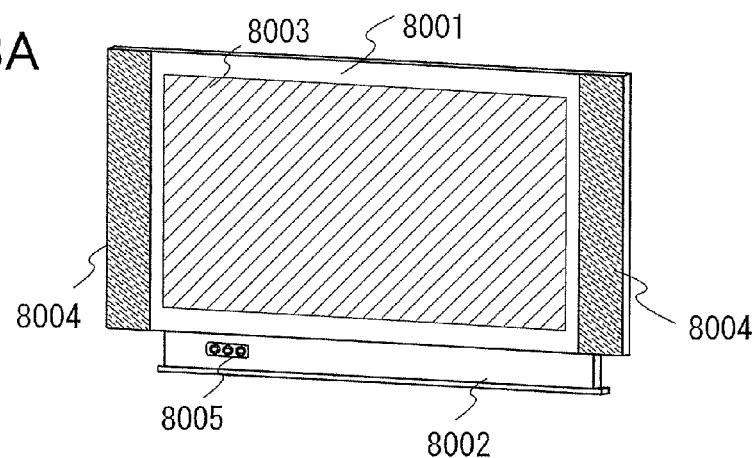
FIGS. 13A to 13F illustrate electronic appliances.

FIG. 13A illustrates a display device including a chassis 8001, a supporting base 8002, a display portion 8003, speaker portions 8004, a video input terminal 8005, and the like. The liquid crystal display device illustrated in FIGS. 11A and 11B or the light-emitting device illustrated in FIGS. 12A and 12B can be used for the display portion 8003, and thus, a high-quality image can be displayed. Note that examples of the display device include all devices for displaying information, such as devices for a personal computer, for receiving TV broadcasting, and for displaying an advertisement.

Figure 13B:
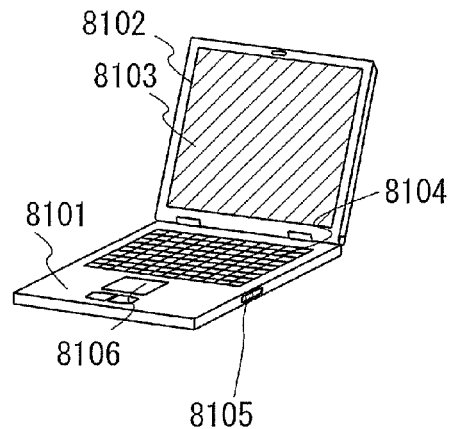

FIG. 13B illustrates a laptop personal computer including a main body 8101, a chassis 8102, a display portion 8103, a keyboard 8104, an external connection port 8105, a pointing device 8106, and the like. The liquid crystal display device illustrated in FIGS. 11A and 11B or the light-emitting device illustrated in FIGS. 12A and 12B can be used for the display portion 8103, and thus, a high-quality image can be displayed.

Figure 13C:
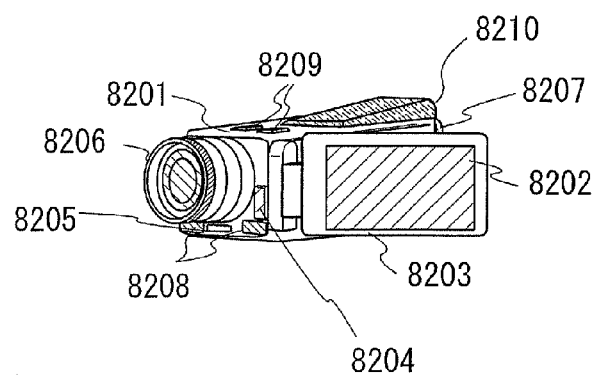

FIG. 13C illustrates a video camera including a main body 8201, a display portion 8202, a chassis 8203, an external connection port 8204, a remote control receiving portion 8205, an image receiving portion 8206, a battery 8207, audio input portions 8208, operation keys 8209, an eyepiece portion 8210, and the like. The liquid crystal display device illustrated in FIGS. 11A and 11B or the light-emitting device illustrated in FIGS. 12A and 12B can be used for the display portion 8202, and thus, a high-quality image can be displayed.

Figure 13D:
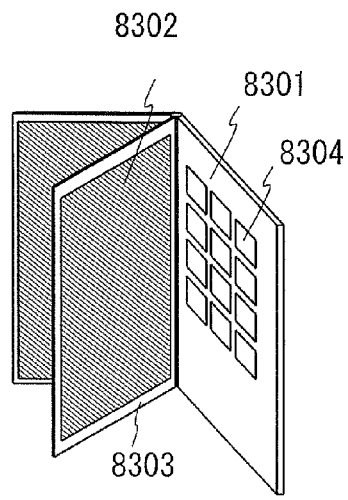

FIG. 13D illustrates an electronic book reader including a main body 8301, a display portion 8302, a chassis 8303, operation switches 8304, and the like. A modem may be built therein, or a structure in which information can be transmitted and received wirelessly may be employed. In a memory portion of the electronic book reader, a NOR-type nonvolatile memory with a memory capacity of 20 to 200 gigabytes (GB) can be used, with which images or sound (music) can be recorded and reproduced. For example, the microprocessor illustrated in FIG. 8 and the RFCPU illustrated in FIG. 9 can be used for the memory portion which stores information of the electronic book reader and a microprocessor which operates the electronic book reader. Further, the liquid crystal display device illustrated in FIGS. 11A and 11B or the light-emitting device illustrated in FIGS. 12A and 12B can be used for the display portion 8302, and thus, a high-quality image can be displayed.

Figure 13E:
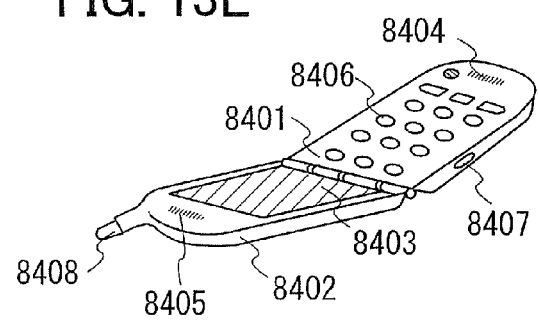

FIG. 13E illustrates a mobile phone which includes a main body 8401, a chassis 8402, a display portion 8403, an audio input portion 8404, an audio output portion 8405, operation keys 8406, an external connecting port 8407, an antenna 8408, and the like. The liquid crystal display device illustrated in FIGS. 11A and 11B or the light-emitting device illustrated in FIGS. 12A and 12B can be used for the display portion 8403, and thus, a high-quality image can be displayed.

Figure 13F:
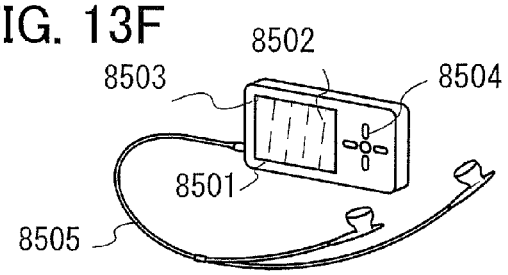

FIG. 13F is a digital audio player, which is a typical example of audio devices. The digital audio player includes a main body 8501, a display portion 8502, a chassis 8503, operation switches 8504, earphones 8505, and the like. Headphones or wireless earphones can be used instead of the earphones 8505. For example, the microprocessor illustrated in FIG. 8 and the RFCPU illustrated in FIG. 9 can be used for a memory portion which stores music information of the digital audio player and a microprocessor which operates the digital audio player. The digital audio player can achieve reductions in size and weight. By using the liquid crystal display device illustrated in FIGS. 11A and 11B or the light-emitting device illustrated in FIGS. 12A and 12B for the display portion 8502, a high-quality image can be displayed even if a screen size is about 0.3 to 2 inches.

Figure 14A:
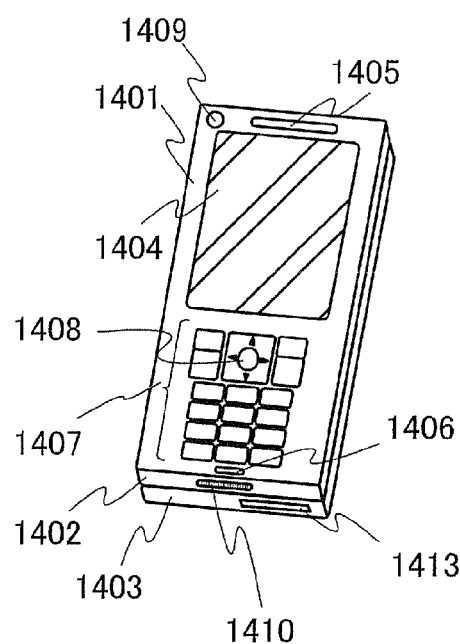
FIGS. 14A to 14C illustrate an electronic appliance.
Figure 14B:
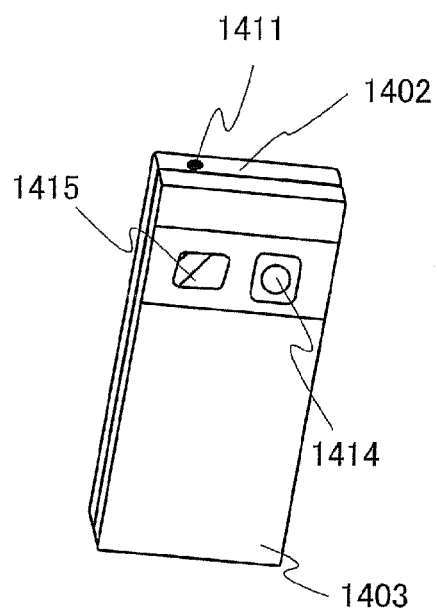
Figure 14C:
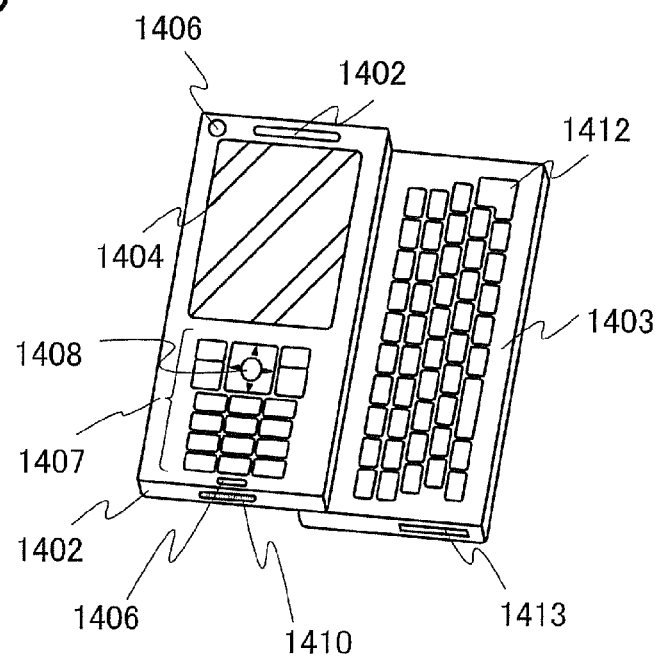

FIGS. 14A to 14C illustrate a mobile phone having a different structure from that in FIG. 13E, and FIG. 14A is a front view, FIG. 14B is a rear view, and FIG. 14C is a development view. A main body 1401 has both a function of a mobile phone and a function of a portable information terminal, and incorporates a computer and can process a variety of data processing in addition to voice calls; thus, this mobile phone is a so-called smartphone.

The main body 1401 has two chassis, a chassis 1402 and a chassis 1403. The chassis 1402 includes a display portion 1404, a speaker 1405, a microphone 1406, operation keys 1407, a pointing device 1408, a camera lens 1409, an external connection terminal 1410, an earphone terminal 1411, and the like, while the chassis 1403 includes a keyboard 1412, an external memory slot 1413, a camera lens 1414, a light 1415, and the like. In addition, an antenna is incorporated in the chassis 1402.

Further, in addition to the above structure, the mobile phone may incorporate a non-contact IC chip, a small-sized memory device, or the like.

The liquid crystal display device illustrated in FIGS. 11A and 11B or the light-emitting device illustrated in FIGS. 12A and 12B can be incorporated in the display portion 1404, and a display direction can be changed as appropriate according to a usage pattern. Because the camera lens 1409 is provided in the same plane as the display portion 1404, the mobile phone can be used as a videophone. Further, a still image and a moving image can be taken with the camera lens 1414 and the light 1415 using the display portion 1404 as a viewfinder. The speaker 1405 and the microphone 1406 can be used for videophone calls, recording and playing sound, and the like without limitation to voice calls.

With the operation keys 1407, making and receiving calls, inputting simple information such as e-mails or the like, scrolling a screen, moving a cursor, and the like are possible. Furthermore, the chassis 1402 and the chassis 1403 (FIG. 14A), which are overlapped with each other, slide out as illustrated in FIG. 14C, and the mobile phone can be used as a portable information terminal. At this time, smooth operation can be conducted using the keyboard 1412 and the pointing device 1408. The external connection terminal 1410 can be connected to an AC adaptor and various types of cables such as a USB cable, and charging and data communication with a personal computer or the like are possible. Furthermore, a large amount of data can be stored and moved by inserting a recording medium into the external memory slot 1413.

Further, in addition to the above-described functions, the mobile phone may also have an infrared communication function, a television reception function, or the like.

In the above-described mobile phone, the liquid crystal display device illustrated in FIGS. 11A and 11B or the light-emitting device illustrated in FIGS. 12A and 12B can be used for the display portion 1404, and thus, a high-quality image can be displayed.

Note that in the electronic appliances described in Embodiment Mode 7, the structures described in Embodiment Modes 1 to 6 can be freely combined.

This application is based on Japanese Patent Application Serial No. 2007-331656 filed with Japan Patent Office on Dec. 25, 2007, the entire contents of which are hereby incorporated by reference.

What is claimed is:

1. A method for manufacturing a semiconductor device comprising the steps of:

forming a brittle layer in a single crystal semiconductor substrate at a predetermined depth from a surface of the single crystal semiconductor substrate by adding an ion species to the single crystal semiconductor substrate;

bonding the surface of the single crystal semiconductor substrate to a surface of a first substrate;

performing heat treatment in a state in which the single crystal semiconductor substrate and the first substrate overlap with each other;

generating a crack in the brittle layer and separating the single crystal semiconductor substrate with a portion of the single crystal semiconductor substrate left over the first substrate, to form a first semiconductor film comprising single crystal semiconductor;

adding impurities imparting one conductivity type to the first semiconductor film by doping to form a semiconductor region into which the impurities are implanted; and forming a second single crystal semiconductor film which is crystallized by solid-phase epitaxy over the semiconductor region.

2. A method for manufacturing a semiconductor device comprising the steps of:

forming a first insulating film over a single crystal semiconductor substrate;

forming a brittle layer in the single crystal semiconductor substrate at a predetermined depth by adding an ion species to the single crystal semiconductor substrate through the first insulating film;

forming a second insulating film over the first insulating film;

bonding a surface of the second insulating film to a surface of a first substrate;

performing heat treatment in a state in which the single crystal semiconductor substrate and the first substrate overlap with each other;

generating a crack in the brittle layer and separating the single crystal semiconductor substrate with a portion of the single crystal semiconductor substrate left, thereby forming the first insulating film, the second insulating film, and a first semiconductor film which is the portion of the single crystal semiconductor substrate over the first substrate;

adding impurities imparting one conductivity type to the first semiconductor film by doping; and forming a second single crystal semiconductor film which is crystallized by solid-phase epitaxy over the first semiconductor film.

3. A method for manufacturing a semiconductor device comprising the steps of:

forming a brittle layer in a single crystal semiconductor substrate at a predetermined depth from a surface of the single crystal semiconductor substrate by adding an ion species to the single crystal semiconductor substrate;

bonding the surface of the single crystal semiconductor substrate to a surface of a first substrate;

performing heat treatment in a state in which the single crystal semiconductor substrate and the first substrate overlap with each other;

generating a crack in the brittle layer and separating the single crystal semiconductor substrate with a portion of the single crystal semiconductor substrate left over the first substrate, to form a first semiconductor film comprising single crystal semiconductor;

adding impurities imparting first one conductivity type to the first semiconductor film by doping to form a semiconductor region into which the impurities are implanted;

forming a second semiconductor film which is crystallized by solid-phase epitaxy over the semiconductor region;

forming a semiconductor island by patterning a stacked layer comprising the semiconductor region and the second semiconductor film;

forming a gate insulating film on the semiconductor island;

forming a gate electrode on the gate insulating film;

adding impurities imparting second one conductivity type to the semiconductor island using the gate electrode as a mask.

4. A method for manufacturing a semiconductor device comprising the steps of:

forming a brittle layer in a single crystal semiconductor substrate at a predetermined depth from a surface of the single crystal semiconductor substrate by adding an ion species to the single crystal semiconductor substrate;

bonding the surface of the single crystal semiconductor substrate to a surface of a first substrate;

performing heat treatment in a state in which the single crystal semiconductor substrate and the first substrate overlap with each other;

generating a crack in the brittle layer and separating the single crystal semiconductor substrate with a portion of the single crystal semiconductor substrate left over the first substrate, to form a first semiconductor film comprising single crystal semiconductor;

adding p-type impurities to part of the first semiconductor film by doping to form a first semiconductor region into which the p-type impurities are implanted;

adding n-type impurities to part of the first semiconductor film by doping to form a second semiconductor region into which the n-type impurities are implanted; and forming a second single crystal semiconductor film which is crystallized by solid-phase epitaxy over the first semiconductor region and the second semiconductor region.

5. The method for manufacturing the semiconductor device, according to claim 1, wherein the impurities imparting one conductivity type in the semiconductor region are included at a concentration of greater than or equal to $5 \times 10^{15}$ atoms/cm$^3$ and less than or equal to $5 \times 10^{17}$ atoms/cm$^3$.

6. The method for manufacturing the semiconductor device, according to claim 1, wherein the heat treatment is performed at a temperature at which the ion species added to form the brittle layer is removable from the single crystal semiconductor substrate.

7. The method for manufacturing the semiconductor device, according to claim 1, wherein the heat treatment is performed at greater than or equal to 400° C. and less than or equal to 600° C.

8. The method for manufacturing the semiconductor device, according to claim 2, wherein the first insulating film comprises silicon oxide and the second insulating film comprises silicon nitride oxide.

9. The method for manufacturing the semiconductor device, according to claim 2, wherein at least one of the first insulating film and the second insulating film is a stacked layer structure including two or more of a silicon oxide film, a silicon nitride film, a silicon oxynitride film, and a silicon nitride oxide film.

10. The method for manufacturing the semiconductor device, according to claim 2, wherein the impurities imparting one conductivity type in the first semiconductor film is at a concentration of greater than or equal to $5 \times 10^{15}$ atoms/cm$^3$ and less than or equal to $5 \times 10^{17}$ atoms/cm$^3$.

11. The method for manufacturing the semiconductor device, according to claim 2, wherein the heat treatment is performed at a temperature at which the ion species added to form the brittle layer is removable from the single crystal semiconductor substrate.

12. The method for manufacturing the semiconductor device, according to claim 2, wherein the heat treatment is performed at greater than or equal to 400° C. and less than or equal to 600° C.

13. The method for manufacturing the semiconductor device, according to claim 3, wherein regions to which the impurities imparting second one conductivity type is added are source and drain regions of a thin film transistor.

14. The method for manufacturing the semiconductor device, according to claim 3, wherein the impurities imparting one conductivity type in the semiconductor region are included at a concentration of greater than or equal to $5 \times 10^{15}$ atoms/cm$^3$ and less than or equal to $5 \times 10^{17}$ atoms/cm$^3$.

15. The method for manufacturing the semiconductor device, according to claim 3, wherein the heat treatment is performed at a temperature at which the ion species added to form the brittle layer is removable from the single crystal semiconductor substrate.

16. The method for manufacturing the semiconductor device, according to claim 3, wherein the heat treatment is performed at greater than or equal to 400° C. and less than or equal to 600° C.

17. The method for manufacturing the semiconductor device, according to claim 4, wherein at least one of the p-type impurities in the first semiconductor region and the n-type impurities in the second semiconductor region are included at a concentration of greater than or equal to $5 \times 10^{15}$ atoms/cm$^3$ and less than or equal to $5 \times 10^{17}$ atoms/cm$^3$.

18. The method for manufacturing the semiconductor device, according to claim 4, wherein the heat treatment is performed at a temperature at which the ion species added to form the brittle layer is removable from the single crystal semiconductor substrate.

19. The method for manufacturing the semiconductor device, according to claim 4, wherein the heat treatment is performed at greater than or equal to 400° C. and less than or equal to 600° C.

* * * * *